United States Patent
Keaveney et al.

(10) Patent No.: US 10,802,066 B1
(45) Date of Patent: Oct. 13, 2020

(54) SINGLE-PIXEL IMAGING OF ELECTROMAGNETIC FIELDS

(71) Applicant: Quantum Valley Ideas Laboratories, Waterloo (CA)

(72) Inventors: James Keaveney, Waterloo (CA); Jennifer Ann Joe Erskine, Waterloo (CA); Chang Liu, Waterloo (CA); Geoffrey Gordon Gillett, Waterloo (CA); James P. Shaffer, Kitchener (CA)

(73) Assignee: Quantum Valley Ideas Laboratories, Waterloo (CA)

( * ) Notice: Subject to any disclaimer, the term of this patent is extended or adjusted under 35 U.S.C. 154(b) by 0 days.

(21) Appl. No.: 16/717,741

(22) Filed: Dec. 17, 2019

(51) Int. Cl.
  *G01R 29/08* (2006.01)
  *G01R 29/10* (2006.01)

(52) U.S. Cl.
  CPC ......... *G01R 29/0885* (2013.01); *G01R 29/10* (2013.01)

(58) Field of Classification Search
  CPC ............................ G01R 29/0885; G01R 29/10
  USPC .......................................................... 324/96
  See application file for complete search history.

(56) References Cited

U.S. PATENT DOCUMENTS

| | | | |
|---|---|---|---|
| 6,285,182 B1 * | 9/2001 | Blake .................... | G01R 15/24 324/96 |
| 7,859,350 B1 | 12/2010 | Schwindt et al. | |
| 10,509,065 B1 | 12/2019 | Shaffer | |
| 2002/0011830 A1 * | 1/2002 | Ito ........................ | G01R 13/347 324/96 |
| 2002/0153874 A1 * | 10/2002 | Jiang .................. | G01N 21/3581 324/96 |
| 2003/0117126 A1 * | 6/2003 | Rahmatian ......... | G01R 29/0885 324/96 |
| 2003/0178584 A1 * | 9/2003 | Arnone ............. | G01N 21/3581 250/495.1 |

(Continued)

OTHER PUBLICATIONS

Horsley, A. and Treutlein, P., 2016. Frequency-tunable microwave field detection in an atomic vapor cell. Applied Physics Letters, 108(21), p. 211102. (Year: 2016).*

(Continued)

*Primary Examiner* — Christopher P McAndrew
(74) *Attorney, Agent, or Firm* — Henry Patent Law Firm PLLC

(57) ABSTRACT

In a general aspect, an imaging method is presented that includes receiving, at a vapor-cell sensor, input optical signals and electromagnetic radiation from at least a test device to generate an output optical signal. The output optical signal is processed at a single pixel camera to generate camera output data. An image of the electromagnetic radiation is constructed by operation of a computer system based on the camera output data. In some implementations, the single pixel camera includes a patterned light generator and a photodetector. In these implementations, the imaging method includes receiving, at the photodetector, patterned instances of the output optical signal generated by the patterned light generator. Each patterned instance represents a respective portion of the image of the electromagnetic radiation. Moreover, the intensity of each patterned instance may be measured, by operation of at least the photodetector, to generate the camera output data.

30 Claims, 5 Drawing Sheets

(56) References Cited

U.S. PATENT DOCUMENTS

| | | | |
|---|---|---|---|
| 2006/0121395 A1* | 6/2006 | Fries | G03F 7/0041 430/324 |
| 2009/0256638 A1 | 10/2009 | Rosenbluh et al. | |
| 2013/0270434 A1 | 10/2013 | Nelson et al. | |
| 2015/0163474 A1* | 6/2015 | You | G01S 17/89 348/46 |
| 2015/0192532 A1 | 7/2015 | Clevenson et al. | |
| 2016/0363617 A1 | 12/2016 | Anderson et al. | |
| 2019/0187198 A1 | 6/2019 | Anderson et al. | |

OTHER PUBLICATIONS

USPTO, Notice of Allowance dated Nov. 8, 2019, in U.S. Appl. No. 16/410,479, 14 pgs.

USPTO, Non-Final Office Action dated Jun. 24, 2019, in U.S. Appl. No. 16/410,479, 34 pgs.

https://cdn.rohde-schwarz.com/dk/seminars_workshops/BaseStationInstallationandAntennaTesting_2017_V1_Shared_DK.pdf retrieved Nov. 7, 2018, 40 pgs.

USPTO, Notice of Allowance dated Oct. 2, 2019, in U.S. Appl. No. 16/410,479, 9 pgs.

"Analyzing RFoCPRI(TM) at Fiber-Based Cell Sites", https://www.viavisolutions.com/en-us/literature/analyzing-rfocpri-fiber-based-cell-sites-application-notes-en.pdf retrieved Nov. 7, 2018, 2 pgs.

"Drone Cell Tower Inspection, Survey, Thermal Imaging and LIDAR", https://abjdrones.com/drone-cell-tower-inspection-services retrieved Nov. 7, 2018, 6 pgs.

"inUAVI: Developing advanced electronic sensors and payloads for UAV's and Aerospace", http://inuavi.io retrieved Nov. 7, 2018, 5 pgs.

Anderson , et al., "A self-calibrating SI-traceable broadband Rydberg atom-based radio-frequency electric field probe and measurement instrument", arXiv:1910.07107v2 [physics.atom-ph], Oct. 18, 2019, 12 pgs.

Fan , et al., "Atom based RF electric field sensing", Journal of Physics B: Atomic, Molecular and Optical Physics, Sep. 9, 2015, 17 pgs.

Fan , et al., "Dispersive radio frequency electrometry using Rydberg atoms in a prism-shaped atomic vapor cell", J. Phys. B: At. Mol. Opt. Phys. 49, 2016, 8 pgs.

Fan , et al., "Effect of Vapor-Cell Geometry on Rydberg-Atom-Based Measurements of Radio-Frequency Electric Fields", Physical Review Applied 4, 044015, 2015, 7 pgs.

Fan , et al., "Subwavelength microwave electric-field imaging using Rydberg atoms inside atomic vapor cells", Optics Letters, vol. 39, No. 10, May 15, 2014, 4 pgs.

Goodman , "Introduction to Fourier Optics", McGraw-Hill Companies, Inc., 1968, 457 pgs.

Holloway , et al., "Atom-Based RF Electric Field Measurements: An Initial Investigation of the Measurement Uncertainties", IEEE International Symposium on Electromagnetic Compatibility, 2015, 6 pgs.

Kumar , et al., "Atom-Based Sensing of Weak Radio Frequency Electric Fields Using Homodyne Readout", Scientific Reports 7:42981, Feb. 20, 2017, 10 pgs.

Kumar , et al., "Rydberg-atom based radio-frequency electrometry using frequency modulation spectroscopy in room temperature vapor cells", Optics Express, vol. 25, No. 8, Apr. 17, 2017, 13 pgs.

Schnars , "Direct phase determination in hologram interferometry with use of digitally recorded holograms", J.Opt. Soc.Am.A, vol. 11, No. 7, Jul. 1994, 5 pgs.

Sedlacek , et al., "Atom-Based Vector Microwave Electrometry Using Ribidium Rydberg Atoms in a Vapor Cell", Physical Review Letters, Aug. 6, 2013, 5 pgs.

Sedlacek , et al., "Microwave electrometry with Rydberg atoms in a vapour cell using bright atomic resonances", Nature Physics, Sep. 16, 2012, 6 pgs.

Sedlacek , et al., "Quantum Assisted Electrometry using Bright Atomic Resonances", arXiv:1205.4461v1 [physics.atom-ph], May 20, 2012, 15 pgs.

Shaffer , et al., "A read-out enhancement for microwave electric field sensing with Rydberg atoms", SPIE Photonics Europe, 2018, Strasbourg, France, 2018, 11 pgs.

Vrijsen , "Collective Quantum Behavior of Atomic Ensembles in High-Finesse Optical Cavities", Dissertation, Stanford University., Dec. 2011, 112 pgs.

* cited by examiner

SINGLE-PIXEL IMAGING OF ELECTROMAGNETIC FIELDS

BACKGROUND

The following description relates to the single pixel imaging of electromagnetic fields.

Over-the-air (OTA) testing is important for many systems that utilize electromagnetic radiation for obtaining and communicating information (e.g., radar systems, medical imaging systems, cellular systems, etc.). Moreover, the testing of such systems during their design, manufacturing, and deployment is also important to ensure regulatory compliance. The challenges of such testing increase as the electromagnetic frequencies utilized by the systems scale to higher frequencies (e.g., greater than 30 GHz) and as integration between multiple components in the systems becomes more tightly knit. An example of system integration in high-frequency electronics is the merging of antennas with transceiver systems and amplifiers. Testing of such highly-integrated and sophisticated systems, particularly in the mm-wave regime, is widely recognized as a looming problem for the automotive and transportation, radar and telecommunications industries.

DETAILED DESCRIPTION

Figure 1:
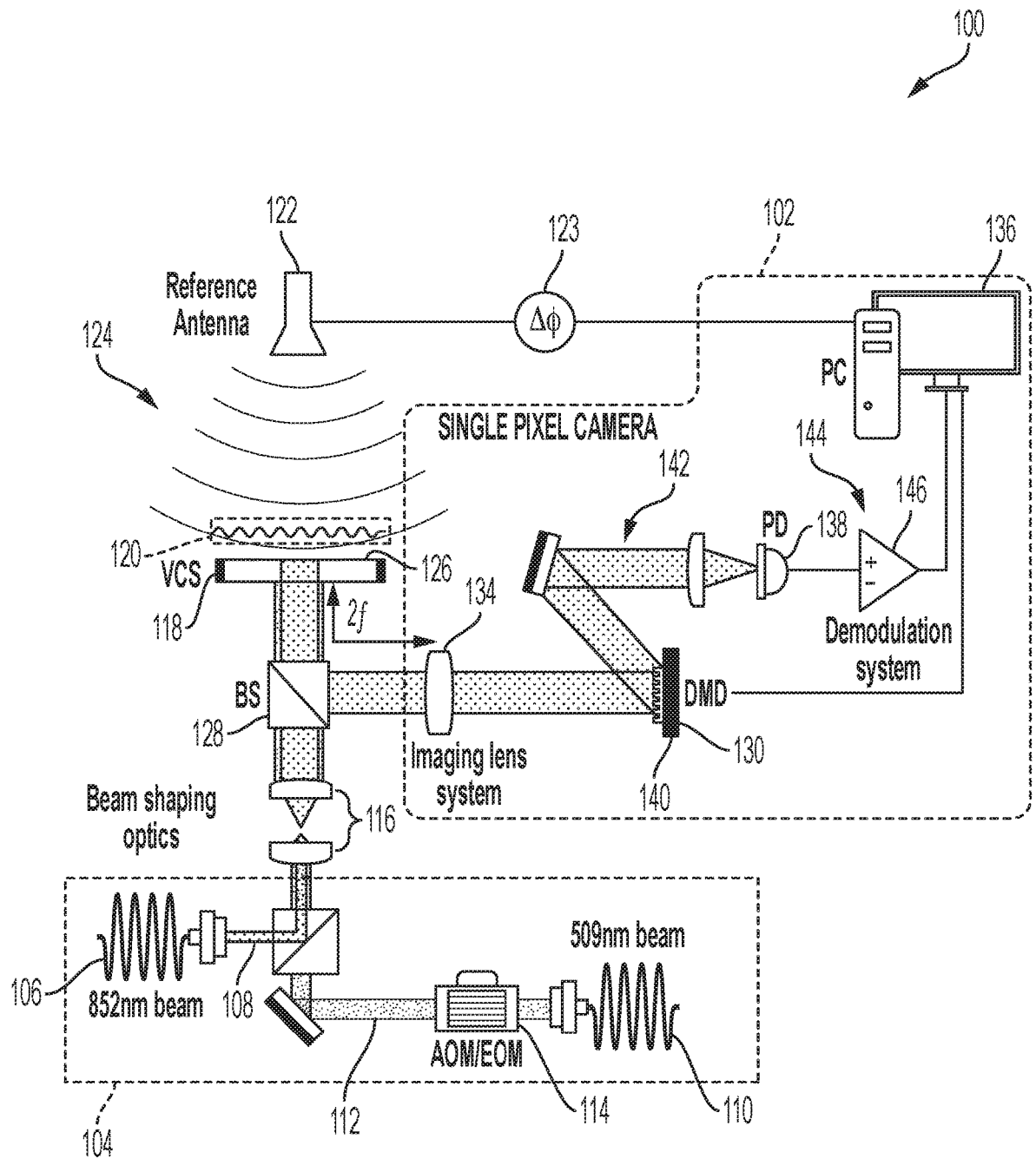
FIG. 1 is a schematic view of an example imaging system having a single pixel camera for constructing an image of electromagnetic radiation.

In a general aspect, an imaging system and method are presented that use a single pixel camera (SPC) in conjunction with Rydberg atom-based sensing to measure electromagnetic fields having high frequencies (MHz-THz). Such electromagnetic fields may include, for example, electrical fields of weak intensity (<1 mV/cm). The single pixel camera may include a patterned light generator. The patterned light generator is configured to receive optical signals from a source and generate patterned (or optically structured) instances of the optical signals using a selectively-variable mask pattern. Examples of the patterned light generator include a micromirror device (or digital micromirror device), a spatial light modulator, and a liquid crystal display. The single pixel camera may also include a photodetector. The photodetector is configured to measure optical characteristics of the patterned instances (e.g., their intensities) and generate signals (e.g., electric signals) representing the measured optical characteristics. In some variations, an optical pathway extends from the patterned light generator to the photodetector. In some variations, multiple optical pathways extend from the patterned light generator to multiple, respective photodetectors.

The single pixel camera brings many advantages over conventional pixel-array (CCD/CMOS) sensors. In particular, the single pixel camera allows the use of conventional analogue signal-processing techniques, e.g., lock-in amplification or another modulation technique, to dramatically increase the signal-to-noise ratio (SNR) when imaging electromagnetic fields. Moreover, since the electromagnetic fields to be imaged are likely to be dominated by relatively low spatial frequencies, compressive sampling techniques may be implemented to greatly speed up image acquisition. These sampling techniques allow video-rate imaging of weak electric fields. The imaging method may include polarization-sensitive detection to further improve the imaging of electromagnetic fields. The imaging method may also include hyperspectral imaging, e.g., acquiring a spectrum for each pixel in the image, to further improve the imaging of electromagnetic fields.

Testing at the high frequencies (e.g., >30 GHz) required for innovative modern communications, as well as radar and medical imaging, will be difficult because of the higher levels of integration between multiple system elements. Such higher integration will, in turn, make over-the-air testing (OTA) notably important. OTA testing enables engineers to observe and measure what happens as radio waves propagate OTA. An example of such integration is the merging of antennas with transceiver systems and amplifiers in high frequency electronics. The testing of highly integrated and sophisticated systems, particularly in the mm-wave regime, is widely recognized as a looming problem for the automotive and transportation, radar, and telecommunications industries. This problem is so fundamental that, at present, industry analysts are projecting it to adversely affect market growth. Furthermore, the problem of increasing production scale when an electronic device becomes mass market is a significant challenge and industry concern, as the electronic device will often require testing during manufacture.

The testing of high frequency electronics, particularly antennas at frequencies greater than 30 GHz, is difficult because a single test antenna must be precisely scanned at wavelength or subwavelength accuracies in the far-field of the device, e.g., far enough away from the device-under-test (DUT) so that the measurement antenna does not interfere with the DUT. Millimeter waves and integrated devices are uniquely challenging. For example, millimeter waves enable the development of small sized antennas and multiple-element phased arrays on a substrate chip. However, the interplay between the antenna, chip elements, and substrate can affect system performance in a notable way. These types of antennas cannot be designed independent of the circuit board to which they are fastened, or even the packaging that surrounds them. For hand-held or wearable devices, it is even important to test the effect the human body has on the functionality of the device. In both the research and development (R&D) phase and production phase, full system testing is required. Each device must comply with a range of regulations before it can enter the market. Vendors also have an interest in having their products comply with specifications in order to compete. Although manufacturers can avoid conformance testing to some extent by using components or modules that are pre-certified, radiated device certification tests are required for every wireless-enabled device and many radio-frequency electronics. OTA testing will be essential for assembly lines and in development labs. Currently, there is no great way to test these types of systems on a production line, particularly when high volumes are needed such as is anticipated for automotive radar systems.

Furthermore, far-field imaging is challenging given the spatial resolution requirements and difficulty of interference from reflections. Near-field imaging of electromagnetic fields is advantageous, since the far field can be inferred from a full image (amplitude and phase) in a single plane. However, there is currently no effective way to do near-field imaging except to tediously scan a single dipole antenna with high spatial resolution across the region of interest. Only a single sensor antenna can be used because it interferes with the emitted field and is constrained by the size of the dipole antenna. Rydberg-atom based sensors, being constructed of all-dielectric materials, offer the closest thing to a true passive sensor that minimally interferes with the DUT emitted field. This minimal interference thus allows the use of Rydberg-atom based sensors in high-resolution near-field imaging. Moreover, it is desirable to have a real-time system that uses Rydberg-atom based sensors for imaging and allows high throughput applications and real-time adjustments for design.

OTA testing of devices is typically done at the R&D stage to identify the pattern of electromagnetic waves emitted from a DUT because OTA testing is complex and time consuming. Testing typically occurs in large anechoic chambers and a calibrated test antenna is mechanically scanned at high precision over the electromagnetic field of the DUT. The speed and cost of such testing usually precludes its use on assembly lines or as a diagnostic in later stages of the supply chain. For many developing technologies, such as driverless cars that rely on radar systems, rigorous standards must be met to ensure safety and functionality, and the difficulty of OTA testing then becomes problematic. An example highlighting the need to meet strict specifications are devices intended for advanced 5G communications. With such devices, the wavelength of electromagnetic radiation becomes shorter, and the transmission distance for a given power level decreases. Beam forming and side-lobe suppression is important for the functionality of such devices.

Moreover, further enhancement to multiple-in multiple-out (MIMO) beamforming technologies will need new designs for high frequency integrated circuit components, such as power amplifiers and transceivers that will be integrated with the antenna modules. Both vendors and carriers will have to optimize communication ranges through increases in transmitted power or enhanced focusing of radiated energy into a sharp and narrow beam to ensure high connectivity. Testing of these properties is complicated by the high levels of system integration. These issues span a broad range of industries such as transportation, automation, communications, and medicine where high frequency signaling is becoming prevalent. Internet of Things (IoT) based improvements to cities, healthcare, industrial manufacturing and autonomous vehicles are all areas of applicability for the imaging method and systems disclosed herein.

New, efficient OTA testing will save a considerable amount of cost in the near future through faster time-to-market development, better quality control and higher-efficiency devices. More sophisticated and advanced products can be enabled by efficient OTA testing. OTA testing can measure the functionality of an entire system. OTA testing is already required for Cellular Telecommunications and Internet Association (CTIA) certification of wireless devices as well as other standards bodies such as the European Telecommunications Standards Institute (ETSI). With wireless devices becoming more and more compact, evaluating the performance of these devices and systems is critical. OTA testing can evaluate device performance and predict reliability in the target environment of a device. Assembly line testing is essential as devices become more and more complicated since failure rates can not only lose a company business but even result in lawsuits and costly recalls.

There are two regimes of operation in the Rydberg-atom based sensor. For strong RF fields (typically >1 mV/cm), the electromagnetically-induced transparency (EIT) is spectrally resolved into two components. The frequency splitting is directly proportional to the strength of the driving RF field, and can be read directly by measuring the transmission spectrum of the probing laser as either the probe or Rydberg coupling laser is scanned across the resonance lines. The absolute change in transmitted laser power over the resonance varies, but is typically around 1% of the total incident laser power.

For weak radio frequency fields (typically <1 mV/cm), the field strength can be measured from the change in transmission of the spectral feature at resonance, and can therefore be done with both lasers locked to the atomic resonance frequencies. In this regime the absolute change in transmitted power is much smaller than in the high-power regime, and can be ~0.01% of the total laser intensity. Such a small change is hard to measure on a large background signal and usually requires signal processing electronics such as a lock-in amplifier or other modulation/demodulation techniques to achieve a good signal-to-noise ratio (SNR).

Applying conventional imaging techniques to the RF field imaging problem is therefore extremely challenging due to the large dynamic range required from the camera. Conventional cameras are based on a 2-dimensional array of photosensitive cells which each measure one spatial element of the image to be captured (i.e. a pixel). Modern camera sensors have many millions of pixels, and for visible and near infra-red wavelengths (300-1000 nm), the sensor is based on silicon, which has a very mature semiconductor industry for fabrication, integration, and miniaturization into devices. However, while this is fine for high-contrast images, for imaging the electromagnetic field with Rydberg-atom sensors, the absolute contrast is low. The low absolute contrast occurs because the signal to be measured sits on a large direct current (DC) background. An alternate method can be useful for this imaging application.

The imaging methods and systems disclosed herein include a single pixel camera. The single pixel camera (alternately known as a 'computational camera'), as its name suggests, uses just one photo-sensitive element (e.g., a photodetector) to construct an image. Spatial resolution is obtained by selectively transmitting or blocking parts of the image with a rapidly varying mask pattern. For example, a digital micromirror device (DMD) may be used to selectively transmit or block parts of the image. The DMD is a 2-dimensional array of mirrors, each of which rests on an electromechanical actuator and can independently be set to either an 'on' or 'off' position. The 'on' or 'off' position may correspond to the incoming light being reflected back out at some angle ±θ, where θ is typically between 10 and 25 degrees depending on the exact DMD model. Other examples of devices that can generate the rapidly varying mask pattern include spatial light modulators and liquid crystal displays.

In many aspects, the imaging methods and systems disclosed herein acquire an image of the radiated electric field amplitude, frequency, and phase using a single pixel camera and a vapor-cell sensor that operates according to principles of Rydberg atom electrometry. The single pixel camera is used to image the read-out laser; the beam from which is modified during interaction with the vapor cell to carry information about the radiated electric field. Such acquisition may allow antennas and other high frequency (GHz-THz) devices and electronics to be tested in the near-field. The vapor-cell sensor can be operated in either the high-field amplitude regime (e.g., greater than about 1 mV/cm) or the low-field amplitude regimes (e.g., less than about 1 mV/cm). The high-field amplitude regime may correspond to electric field magnitudes where spectral splitting in an optical transmission of the vapor-cell sensor is resolvable, and the low-field amplitude regime may correspond to electric field magnitudes where spectral splitting in an optical transmission of the vapor-cell sensor is not resolvable. Each element (or optically resolvable point) in the image is an absolute sensor allowing its use in standards and/or compliance testing. The throughput (e.g., the frame rate) of the camera system can be relatively high, particularly (but not necessarily) if compressive sampling techniques are employed, enabling use in production-line environments. This throughput may be further increased if one or more expected characteristics of the radiated electric field are known (e.g., as a result of modeling, as a result of feedback during image acquisition, etc.). In many implementations, the imaging methods and systems image electric field amplitude, frequency, and/or phase information using Rydberg atom electrometry combined with a single pixel camera, so that antennas and other high frequency devices can be OTA tested in a small volume, in the near-field, and with high sensitivity.

The single pixel camera may be used to determine spatial characteristics of the electromagnetic radiation, such as amplitude, phase, frequency, and so forth. For example, the single pixel camera may determine the spatial characteristics of an amplitude of the electromagnetic field (e.g., an electric field, a magnetic field, or both). In another example, the single pixel camera may determine a holographic image generated by interference between a DUT and a reference electromagnetic field. Since the readout method is based on optical fields, the spatial resolution can be much less than the radio frequency (RF) wavelength, and adjusted based on the exact test requirements to balance spatial resolution with imaging speed. The spatial extent of the electromagnetic field that can be imaged is set by the spatial extent of the vapor-cell sensor (or other RF-sensitive atom-like systems such as color centers in solid-state systems). The phase resolution is set by the thickness of the imaging sensor and spatial resolution by the imaging of the readout lasers. The phase resolution can also be made much smaller than the RF wavelength. As an example, a planar vapor-cell sensor with dimensions 12×12×0.25 mm, imaged with 64×64 pixels would have spatial resolution of better than $\lambda/20$ and phase resolution of $\lambda/16$ for an RF wavelength of 4 mm at an RF frequency of 75 GHz.

A single pixel camera allows for high sensitivity imaging in the low-field amplitude regime, since the imaging system incorporating the single pixel camera can integrate fast analog and digital electronics for modulation/demodulation techniques. Such techniques may include lock-in detection or various forms of frequency modulated (FM) spectroscopy. Other forms of analog or digital signal processing may also be used to increase the signal-to-noise ratio. Much of the signal processing can be accomplished before digitization, so the dynamic range can be tailored on a per-image basis and/or optimized in real-time, depending on the exact application. In addition, since the single pixel camera is based on a single photosensitive element, the detector can be optimally chosen. The single pixel camera can be sensitive to particular wavelengths, or a range of wavelengths, that lie outside of a range where conventional cameras operate.

One possible configuration of the imaging system is to use multiple single pixel cameras in parallel to image multiple optical wavelengths simultaneously and use the correlated detection to improve sensitivity. Another possible configuration of the imaging system is to use a vapor-cell sensor with multiple vapors (e.g., Rb and Cs atomic species), combined with another set of excitation lasers to increase precision or image more than one frequency of the electromagnetic field emitted from a DUT. With a multi-wavelength single pixel camera imaging setup, it is possible to image two completely independent RF frequencies at the same time, with perfect spatial overlap. In this imaging setup, the spatial information may be set by a selectively-variable mask pattern that is wavelength-agnostic (e.g., a DMD, a spatial light modulator, a liquid crystal display, etc.). A further possible configuration of the imaging system is to use polarization-sensitive imaging in the detection system to infer the polarization of the electromagnetic field.

In some aspects, the imaging methods and systems include a selectively-variable mask pattern. During operation, the selectively-variable mask pattern selectively switches between optical patterns in response to a control signal to acquire the spatial information of the image. The readout of full images after processing can be real-time, because video frame rates and higher (20-30 Hz) can be achieved. High frame rates enable feedback-based tuning or application on assembly lines. The imaging methods and systems may also utilize compressive sampling techniques or a priori knowledge of the target electromagnetic field that is being measured to further improve imaging speed.

The imaging methods and systems are compatible with either the high- or low-field amplitude regimes, allowing linearity testing or testing of ultra-low power devices. In either field amplitude regime, each image element (or single pixel) is an absolute sensor so it can be used as a standard. With the knowledge of the electromagnetic field amplitude and phase in any given plane, it is possible to use wave propagation algorithms such as the Fresnel transform to extrapolate the field information in any other plane.

A single pixel camera overcomes signal processing challenges associated with Rydberg atom-based electric field sensing in an imaging configuration. The optical transmission of the probe laser through the vapor medium (e.g., an alkali vapor) in the absence of the electromagnetic field can be a large fraction of the incident power, and is typically around 50% depending on the optical path length through the vapor-cell sensor (e.g., a thickness of the vapor-cell sensor). In the weak-field regime, the absolute change in probe laser transmission due to the presence of the electromagnetic fields measured by the vapor-cell sensor is typically very small, around 0.01% of the total incident power. With a conventional camera system, the detection is DC-coupled and there is no opportunity to run signal processing on a per-pixel basis before the signal is digitized, although the averaging of multiple pixels may be possible. Hence, to detect the change due to the electric field, a dynamic range of 5000 or better is desired. In terms of a digital signal, such detection requires the imaging sensor to have an effective (i.e., including noise) bit-depth of 13-bits or more. This level of bit-depth is challenging for most imaging sensors, given thermal (e.g., dark counts) and readout noise. While there are commercial imaging sensors available with a high bit-depth, the imaging sensors usually require active cooling to minimize dark count. In addition to being expensive, the cooling requirement adds significant bulk and electrical power requirements to any resulting camera system, limiting the possibility for future miniaturization and integration.

Imaging methods and systems that incorporate a single pixel camera allow notable advantages. For example, detection on a single-element detector is done in the analog domain and is therefore compatible with signal processing techniques to optimize the signal-to-noise ratio. The detection can be AC-coupled and therefore a small change on a large DC background can be isolated and amplified, allowing per-pixel measurement of small electric fields. Moreover, the detection scheme is not limited to small field amplitudes—the imaging methods and systems are readily applicable to the high-amplitude regime as well as the low-amplitude regime. Furthermore, since single element detectors are used, the signal processing can be done either in the analog domain before digitization or in software after digitization.

Imaging can be done either in the image plane or the Fourier plane with minimal change to the optical arrangement. Switching between the two planes may be advantageous in certain circumstances for applying optical filtering to the image acquisition.

The imaging methods and systems also allow polarization-sensitive imaging with only minor changes to the optical setup, allowing for polarization resolved RF imaging. Video or higher-rate (20-30 Hz) imaging is possible, allowing integration into production environments or real-time optimization of devices. Compressive sampling or knowledge of the target electromagnetic fields can be used to further increase frame rate. Since the electromagnetic fields to be imaged may be smoothly varying, with low spatial frequencies, compressive sampling should be very effective for such fields. As a result, the compressive sampling may allow a significant increase in frame rate with an acceptably small loss of image quality. Moreover, the imaging methods and systems disclosed herein include single-element detectors, which can be more cost effective than conventional cameras. The single-element detectors can also be used to reduce the size and power consumption of Rydberg atom-based electromagnetic imaging.

Now referring to FIG. 1, a schematic view is presented of an example imaging system 100 having a single pixel camera 102 for constructing an image of electromagnetic radiation. The electromagnetic radiation may have a frequency ranging from 100 MHz to 1 THz. The example imaging system 100 includes a laser system 104 for generating optical signals. The laser system 104 may include two or more lasers for generating respective output signals, such as respective beams of light. For example, as shown in FIG. 1, the laser system 104 may include a first laser 106 configured to generate a first beam of light 108 and a second laser 110 configured to generate a second beam of light 112. The first and second beams of light 108, 112 may have wavelengths of 852 nm and 509 nm, respectively. However, other wavelengths are possible. The laser system 104 may also include one or more optical elements for manipulating the optical signals, such as lenses, mirrors, beam splitters, optical filters, fiber optic elements, and so forth. The one or more optical elements may guide the optical signals to propagate along a common optical pathway. In some variations, the laser system 104 comprises a modulator 114 configured to control an amplitude, a phase, or a frequency of at least one of the optical signals generated by the laser system 104. Examples of the modulator 114 include an acousto-optic modulator (AOM) and an electro-optic modulator (EOM). The modulator may control the amplitude, the phase, and the frequency individually or in any combination thereof. In some instances, the laser system 104 includes a modulator for each laser and all generated optical signals are controlled in one or both of an amplitude and a frequency.

The example imaging system 100 may optionally include beam shaping optics 116 to manipulate a spatial distribution of the optical signals generated by the laser system 104. For example, the beam shaping optics 116 may manipulate the spatial distribution of the optical signals to have a shape suitable for interacting with vapor in a vapor-cell sensor. The example imaging system 100 also includes a vapor-cell sensor 118 (VCS) configured to receive electromagnetic radiation from a least a test device 120 (or device-under-test) and generate an output optical signal based on the optical signals from the laser system 104. In some implementations, such as shown in FIG. 1, the example imaging system 100 includes a reference antenna 122 configured to generate reference electromagnetic radiation 124 that is received by the vapor-cell sensor 118. The reference antenna 122 may be optionally coupled to a controller 123 for regulating a phase of the reference electromagnetic radiation 124.

The common optical pathway may extend from the laser system 104 to the vapor-cell sensor 118 to allow the optical signals from the laser system 104 to serve as input optical signals for the vapor-cell sensor 118. In some implementations, the vapor-cell sensor 118 includes a dielectric mirror 126, which may be disposed on a side of the vapor-cell sensor 118 adjacent the test device 120. The input optical signals may pass through a vapor in the vapor-cell sensor 118, and while passing, reflect off the dielectric mirror 126 to exit the vapor-cell sensor 118. FIG. 1 depicts the input optical signals entering and exiting the vapor-cell sensor 118 at an angle perpendicular to the vapor-cell sensor 118. However, other incident and reflected angles are possible for the input optical signals. In some variations, a beam splitter 128 (BS) is present on the common optical pathway to intercept the reflected input optical signals from the vapor-cell sensor 118. The beam splitter 128 is configured to direct at least one of the reflected input optical signals onto another optical pathway, such as an imaging pathway (or arm) of the example imaging system 100. These directed optical signals may serve as respective output optical signals generated by the vapor-cell sensor 118.

The single pixel camera 102 is positioned along the imaging pathway (or arm) of the example imaging system 100 to receive one or more output optical signals generated by the vapor-cell sensor 118. The single pixel camera 102 is configured to generate camera output data by processing the one or more output optical signals from the vapor-cell sensor 118. In many variations, the single pixel camera 102 includes a patterned light generator 130 configured to receive an output optical signal from the vapor-cell sensor 118 and generate patterned instances of the output optical signal. Examples of the patterned light generator 130 include a micromirror device, a spatial light modulator, and a liquid crystal display. In FIG. 1, the patterned light generator 130 is depicted as a digital micromirror device (DMD). The patterned light generator 130 includes a variable mask configured to selectively switch between optical patterns in response to a control signal. The patterned instances of the output optical signal may correspond to a structured optical signal or beam of light based on the optical patterns. The structured optical signal or beam of light may be structured spatially in amplitude, phase, frequency, or any combination thereof. Moreover, the structured optical signal or beam of light may vary with time. For example, the structured optical signal or beam of light may have a cross-section that includes a patterned intensity, a patterned phase, a patterned frequency, or any combination thereof, that varies with time (e.g., cycles of time). Other types of optical structure are possible.

In many implementations, the example imaging system 100 includes an optical pathway extending from the vapor-cell sensor 118 to the patterned light generator 130. A portion of the optical pathway may overlap with the common optical pathway extending from the laser system 104 to the vapor-cell sensor 118. The beam splitter 128 may define a branch point of the optical pathway from the common optical pathway. A lens system 134 is disposed along the optical pathway a first distance from the vapor-cell sensor 118 and a second distance from the patterned light generator 130. The lens system 134 is configured to deliver (e.g., image) the output optical signal onto the patterned light generator, and in some variations, is part of the single pixel camera 102. In FIG. 1, the first distance and the second distance equal twice a focal distance (2f) of the lens system 134. However, other distances are possible. For example, the first distance and the second distance may equal the focal distance (f) of the lens system 134. In this example, the patterned light generator 234 is positioned in a Fourier plane of the lens 235. Although FIG. 1 depicts the lens system 134 as having a single convex lens, this depiction is for purposes of illustration only. In general, the lens system 134 may include multiple instances and types of lenses and may also include other types of optical elements (e.g., mirrors, filters, etc.).

In some variations, the lens system 134 defines a real-space image plane on the optical pathway. The patterned light generator 130 may be disposed on the optical pathway at the real-space image plane, and the vapor-cell sensor 118 may be disposed on the optical pathway at a real-space object plane associated with the real-space image plane. In some variations, the lens system 134 defines a Fourier image plane on the optical pathway. The patterned light generator 130 may be disposed on the optical pathway at the Fourier image plane, and the vapor-cell sensor 118 may be disposed on the optical pathway at a Fourier object plane associated with the Fourier image plane.

The example imaging system 100 also includes a computer system 136 configured to generate an image of the electromagnetic radiation based on the camera output data. In some variations, such as shown in FIG. 1, the computer system 136 is part of the single pixel camera 102. The computer system 136 may be communicatively coupled to the patterned light generator 130 to exchange signals therebetween, such as control signals for selectively switching the variable mask between optical patterns. In some instances, the communicative coupling includes electrical coupling. For example, electrical power may be supplied to the patterned light generator 130 from the computer system 132. In another example, electrical signals may be exchanged between the patterned light generator 130 and the computer system 132. However, other types of communicative coupling are possible (e.g., optical coupling via optical fibers).

In some implementations, the single pixel camera 102 includes a photodetector 138 (PD) and a micromirror device 140 (i.e., the patterned light generator 130 is a micromirror device). The micromirror device 140 includes an array of micromirrors and is configured to selectively orient, in response to a control signal, one or more micromirrors in the array of micromirrors to define a spatial pattern. An optical pathway 142 extends from the micromirror device 140 to the photodetector 128 and is part of the single pixel camera 102. The optical pathway 142 may be defined by optical elements that guide output optical signals from the micromirror device 140 to the photodetector 138. Examples of the optical elements include lenses, mirrors, beam splitters, optical filters, fiber optic elements, and so forth.

The spatial pattern defined by the array of micromirrors is configured to generate a structured optical signal when the output optical signal from the vapor-cell sensor 118 interacts with the array of micromirrors. In some variations, the spatial pattern includes a positive portion configured to reflect a first portion of the structured optical signal along a first direction and a negative portion configured to reflect a second portion of the structured optical signal along a second direction. The positive portion may be defined by a first group of selectively oriented micromirrors, and negative portion may be defined by a second group of selectively oriented micromirrors. The negative portion corresponds to an inverse of the positive portion. In some instances, such as shown in FIG. 1, the optical pathway 142 (or a portion thereof) may be coincident with the first direction and thus be positioned to receive the first portion of the structured optical signal. In these instances, the photodetector 138 receives portions of the output optical signal from the positive portion of the spatial pattern. Alternatively, the optical pathway 142 (or a portion thereof) may be coincident with the second direction and thus be positioned to receive the second portion of the structured optical signal. In these instances, the photodetector 138 receives portions of the output optical signal from the negative portion of the spatial pattern.

In further implementations, the example imaging system 100 may include a demodulation system 144 electrically coupled to the photodetector 138. The demodulation system may include an analog-to-digital converter electrically coupling a lock-in amplifier 146 to the computer system 136. In these implementations, the computer system 136 may be configured to generate control signals for the patterned light generator 130. The computer system 136 may also be configured to generate (or process) image data in response to demodulation signals from the demodulation system 144 (e.g., digital signals from the analog-to-digital converter). The image data may represent a spatially-dependent amplitude of the electromagnetic radiation, a spatially-dependent phase of the electromagnetic radiation, a spatially-dependent frequency of the electromagnetic radiation, or any combination thereof.

Figure 2A:
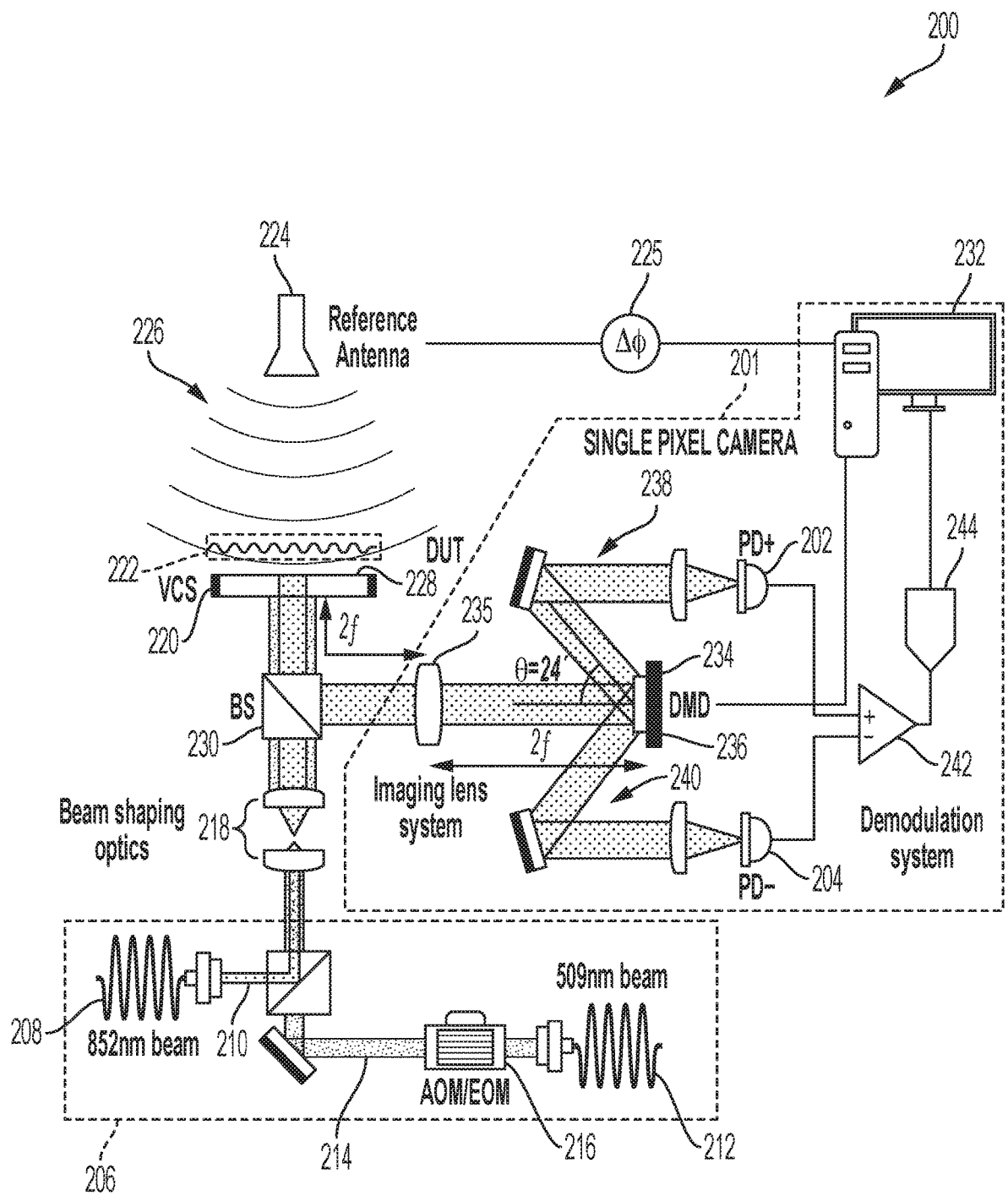
FIG. 2A is a schematic view of example imaging system having a single pixel camera that includes two photodetectors.

Although FIG. 1 depicts the single pixel camera 102 as having only a single photodetector, other numbers of photodetectors are possible. FIG. 2A presents a schematic view of an example imaging system 200 having a single pixel camera 201 that includes two photodetectors 202, 204. The example imaging system 200 includes a laser system 206 for generating optical signals. The laser system 206 may include two or more lasers for generating respective output signals, such as respective beams of light. For example, as shown in FIG. 2A, the laser system 206 may include a first laser 208 configured to generate a first beam of light 210 and a second laser 212 configured to generate a second beam of light 214. The laser system 206 may also include one or more optical elements for manipulating the optical signals, such as lenses, mirrors, beam splitters, optical filters, fiber optic elements, and so forth. The one or more optical elements may guide the optical signals to propagate along a common optical pathway. In some variations, the laser system 206 comprises a modulator 216 configured to control an amplitude, a phase, or a frequency of at least one of the optical signals generated by the laser system 206. Examples of the modulator 216 include an acousto-optic modulator (AOM) and an electro-optic modulator (EOM). The modulator 216 may control the amplitude, the phase, and the frequency individually or in any combination thereof. In some instances, the laser system 206 includes a modulator for each laser and all generated optical signals are controlled in amplitude, phase, frequency, or any combination thereof.

The example imaging system 200 may optionally include beam shaping optics 218 to manipulate a spatial distribution of the optical signals generated by the laser system 206. For example, the beam shaping optics 218 may manipulate the spatial distribution of the optical signals to have a shape suitable for interacting with vapor in a vapor-cell sensor. The example imaging system 200 also includes a vapor-cell sensor 220 configured to receive electromagnetic radiation from at least a test device 222 (or device-under-test) and generate an output optical signal based on the optical signals from the laser system 206. In some implementations, such as shown in FIG. 2A, the example imaging system 200 includes a reference antenna 224 configured to generate reference electromagnetic radiation 226 that is received by the vapor-cell sensor 220. The reference antenna 224 may be optionally coupled to a controller 225 for regulating a phase of the reference electromagnetic radiation 226.

The common optical pathway may extend from the laser system 206 to the vapor-cell sensor 220 to allow the optical signals from the laser system 206 to serve as input optical signals for the vapor-cell sensor 220. In some implementations, the vapor-cell sensor 220 includes a dielectric mirror 228, which may be disposed on a side of the vapor-cell sensor 220 adjacent the test device 222. The input optical signals may pass through a vapor in the vapor-cell sensor 220, and while passing, reflect off the dielectric mirror 228 to exit the vapor-cell sensor 220. FIG. 2A depicts the input optical signals entering and exiting the vapor-cell sensor 220 at an angle perpendicular to the vapor-cell sensor 220. However, other incident and reflected angles are possible for the input optical signals. In some variations, a beam splitter 230 (BS) is present on the common optical pathway to intercept the reflected input optical signals from the vapor-cell sensor 220. The beam splitter 230 is configured to direct at least one of the reflected input optical signals onto another optical pathway, such as an imaging pathway (or arm) of the example imaging system 200. These directed optical signals may serve as respective output optical signals generated by the vapor-cell sensor 220.

The example imaging system 200 additionally includes the single pixel camera 201, which is configured to generate camera output data by processing the output optical signal from the vapor-cell sensor 220. The single pixel camera 201 is positioned along the imaging pathway (or arm) of the example imaging system 200 to receive one or more output optical signals generated by the vapor-cell sensor 220. In FIG. 2A, the single pixel camera 201 is depicted as having two photodetectors 202, 204. However, other numbers of photodetectors are possible (e.g., 1, 3, 4, etc.). The example imaging system 200 also includes a computer system 232 that is configured to generate an image of the electromagnetic radiation based on the camera output data. The computer system 232 may, in some variations, be part of the single pixel camera 201.

In many implementations, the example imaging system 200 includes a patterned light generator 234 configured to receive an output optical signal from the vapor-cell sensor 220 and generate patterned instances of the output optical signal. Examples of the patterned light generator 234 include a micromirror device, a spatial light modulator, and a liquid crystal display. In FIG. 2A, the patterned light generator 234 is depicted as a digital micromirror device (DMD). The patterned light generator 234 includes a variable mask configured to selectively switch between optical patterns in response to a control signal. The patterned instances of the output optical signal may correspond to a structured optical signal or beam of light based on the optical patterns. The structured optical signal or beam of light may be structured spatially in amplitude, phase, frequency, or any combination thereof. The structured optical signal or may of light may also vary with time. For example, the structured optical signal or beam of light may have a cross-section that includes a patterned intensity, a patterned phase, a patterned frequency, or any combination thereof, that varies with time (e.g., cycles of time). Other types of optical structure are possible. The control signal for the patterned light generator 234 may originate with the computer system 232.

In many implementations, the example imaging system 200 includes an optical pathway extending from the vapor-cell sensor 220 to the patterned light generator 234. A portion of the optical pathway may overlap with the common optical pathway extending from the laser system 206 to the vapor-cell sensor 220. The beam splitter 230 may define a branch point of the optical pathway from the common optical pathway. A lens system 235 is disposed along the optical pathway a first distance from the vapor-cell sensor 220 and a second distance from the patterned light generator 234. The lens system 235 is configured to deliver (e.g., image) the output optical signal onto the patterned light generator 234. In FIG. 2A, the first distance and the second distance equal twice a focal distance (2f) of the lens system 235. However, other distances are possible. For example, in FIG. 2B, the first distance and the second distance equal the focal distance (f) of the lens system 235. In this example, the patterned light generator 234 is positioned in a Fourier plane of the lens system 235. Although FIG. 2A depicts the lens system 235 as having a single convex lens, this depiction is for purposes of illustration only. In general, the lens system 235 may include multiple instances and types of lenses and may also include other types of optical elements (e.g., mirrors, filters, etc.).

Figure 2B:
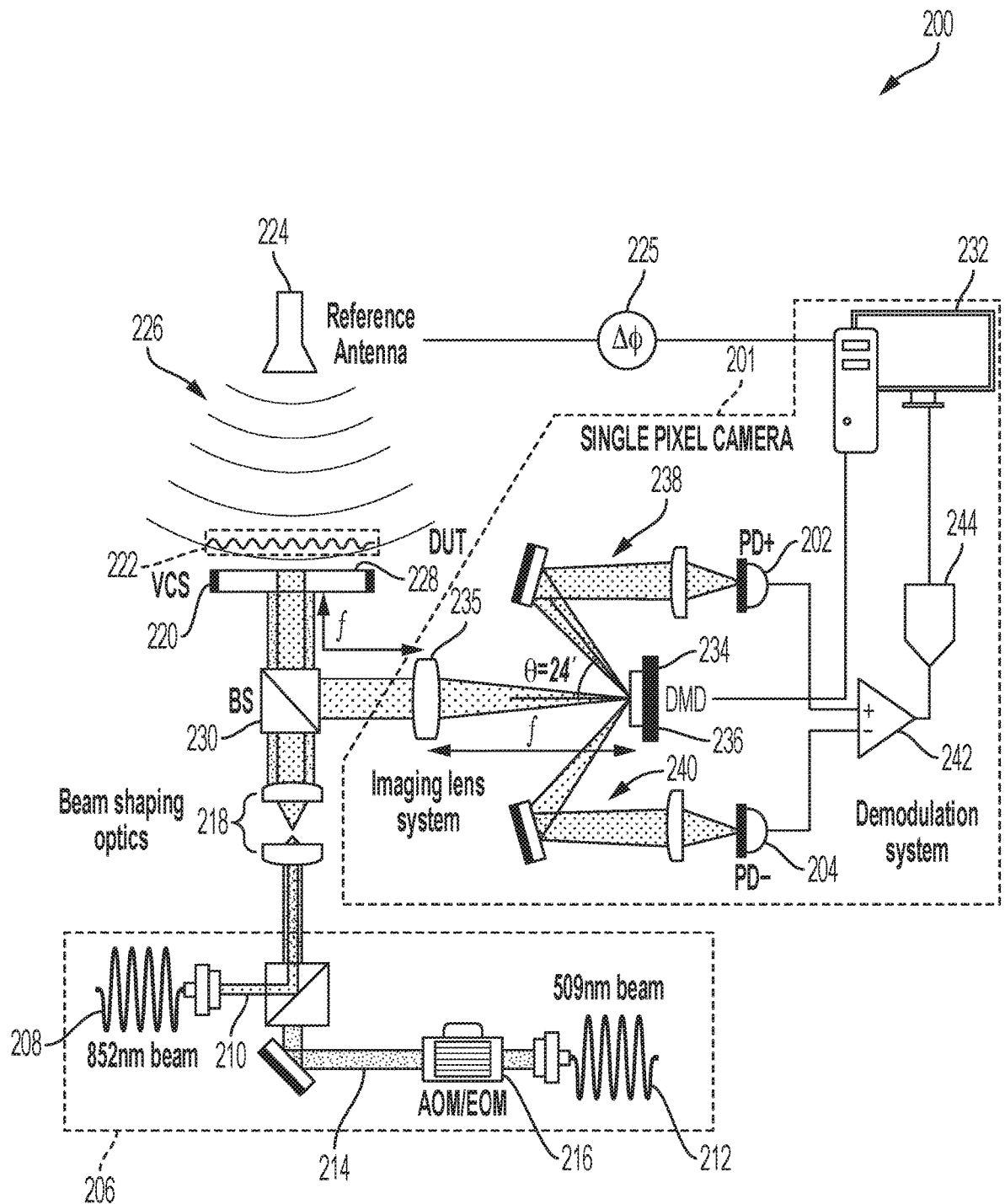
FIG. 2B is a schematic view of the example imaging system of FIG. 2A, but in which the image of the electromagnetic radiation is constructed using a Fourier image plane of a lens system.

In some implementations, as shown in FIGS. 2A and 2B, the single pixel camera 201 includes a first photodetector 202, a second photodetector 204, and a micromirror device 236. The micromirror device 236 includes an array of micromirrors and is configured to selectively orient, in response to a control signal, one or more micromirrors in the array of micromirrors to define a spatial pattern. A first optical pathway 238 extends from the micromirror device 236 to the first photodetector 202, and a second optical pathway 240 extends from the micromirror device 236 to the second photodetector 204. The first and second optical pathways 238, 240 may be defined by optical elements that guide output optical signals from the micromirror device 236 to the first and second photodetectors 202, 204. Examples of the optical elements include lenses, mirrors, beam splitters, optical filters, fiber optic elements, and so forth.

The spatial pattern defined by the array of micromirrors is configured to generate a structured optical signal when the output optical signal from the vapor-cell sensor 220 interacts with the array of micromirrors. The spatial pattern includes a positive portion configured to reflect a first portion of the structured optical signal onto the first optical pathway 238, and a negative portion configured to reflect a second portion of the structured optical signal onto the second optical pathway 240. The positive portion may be defined by a first group of selectively oriented micromirrors, and negative portion may be defined by a second group of selectively oriented micromirrors. The negative portion corresponds to an inverse of the positive portion. In these implementations, the first photodetector 202 may correspond to a "positive" photodetector (PD+) that receives portions of the output optical signal from the positive portion, and the second photodetector 204 may correspond to a "negative" photodetector (PD−) that receives portions of the output optical signal from the negative portion.

In further implementations, the example imaging system 200 may include a demodulation system electrically coupled to the first and second photodetectors 202, 204. The demodulation system may include an analog-to-digital converter 244 electrically coupling a lock-in amplifier 242 to the computer system 232. However, other components and configurations of the demodulation system are possible. In these implementations, the computer system 232 may be configured to generate control signals for the micromirror device 236. The computer system 232 may also be configured to generate (or process) image data in response to demodulation signals from the demodulation system (e.g., digital signals from the analog-to-digital converter 244). The image data may represent one or both of a spatially-dependent amplitude and a spatially-dependent phase of the electromagnetic radiation.

Figure 2C:
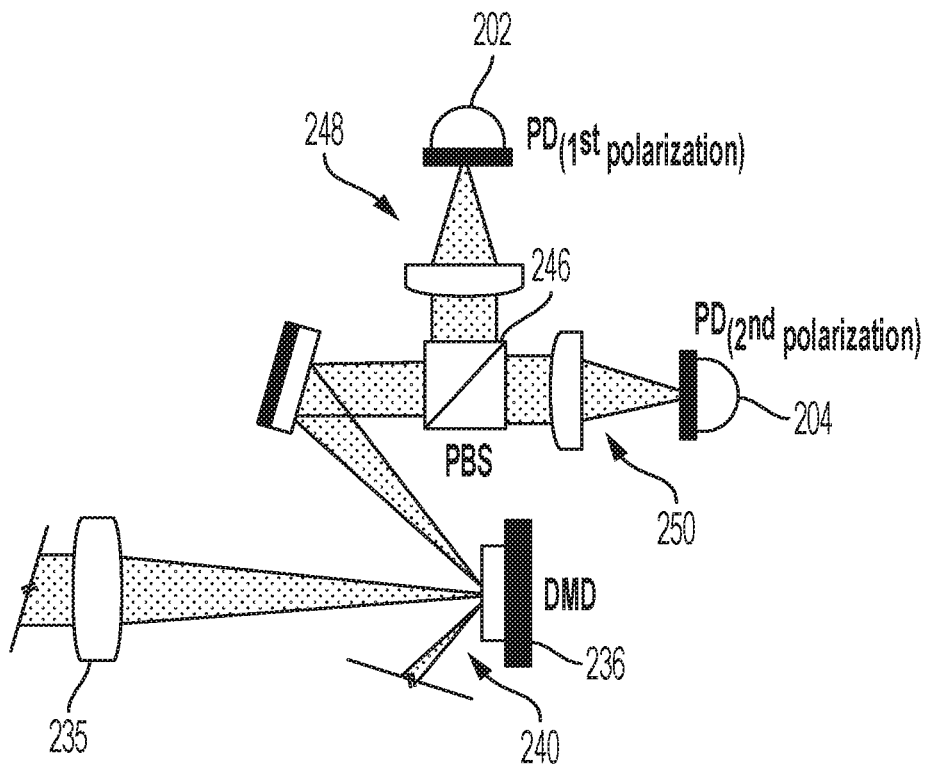
FIG. 2C a schematic diagram of the example imaging system of FIG. 2A, but in which the single pixel camera includes a polarizing beam splitter.

The example imaging system 200 may be configured to construct the image of the electromagnetic radiation using different optical signals, such as polarized optical signals and multiple wavelength optical signals. For example, FIG. 2C presents a schematic diagram of the example imaging system 200 of FIG. 2A, but in which the single pixel camera 201 includes a polarizing beam splitter 246. In these implementations, single pixel camera 201 includes the first photodetector 202, the second photodetector 204, a micromirror device 236 (e.g., a DMD), and the polarizing beam splitter 246. The micromirror device 236 includes an array of micromirrors and is configured to selectively orient, in response to a control signal, one or more micromirrors in the array of micromirrors to define a spatial pattern. The polarizing beam splitter 246 is configured to split a structured optical signal from the micromirror device 236 into first and second polarized optical signals. The first and second polarized optical signals may have, respectively, first and second polarization. For example, first and second polarized optical signals may have vertical and horizontal polarizations. Although FIG. 2C depicts the polarizing beam splitter 246 as positioned to receive portions of the output optical signal from the positive portion of the spatial pattern defined by the array of micromirrors, the polarizing beam splitter 246 may be positioned to receive portions of the output optical signal from the negative portion of the spatial pattern. Other positions may also be possible.

A first polarized optical pathway 248 extends from the polarizing beam splitter 246 to the first photodetector 202, and a second polarized optical pathway 250 extends from the polarizing beam splitter 246 to the second photodetector 204. The first and second polarized optical pathways 248, 250 may be defined by optical elements that guide the first and second polarized optical signals from the polarizing beam splitter 246 to the first and second photodetectors 202, 204, respectively. Examples of the optical elements include lenses, mirrors, beam splitters, optical filters, fiber optic elements, and so forth. The polarizing beam splitter 246 is oriented to direct the first polarized optical signal onto the first polarized optical pathway 248 and the second polarized optical signal onto the second polarized optical pathway 250. The first photodetector 202 may correspond to a photodetector ($PD_{1st\ Polarization}$) receiving portions of the output optical signal from the positive portion with the first polarization (e.g., a vertical polarization). The second photodetector 204 may correspond to a photodetector ($PD_{2nd\ Polarization}$) receiving portions of the output optical signal from the positive portion with the second polarization (e.g., a horizontal polarization). However, other polarities and polarizations are possible for, respectively, the portions and polarizations.

Figure 2D:
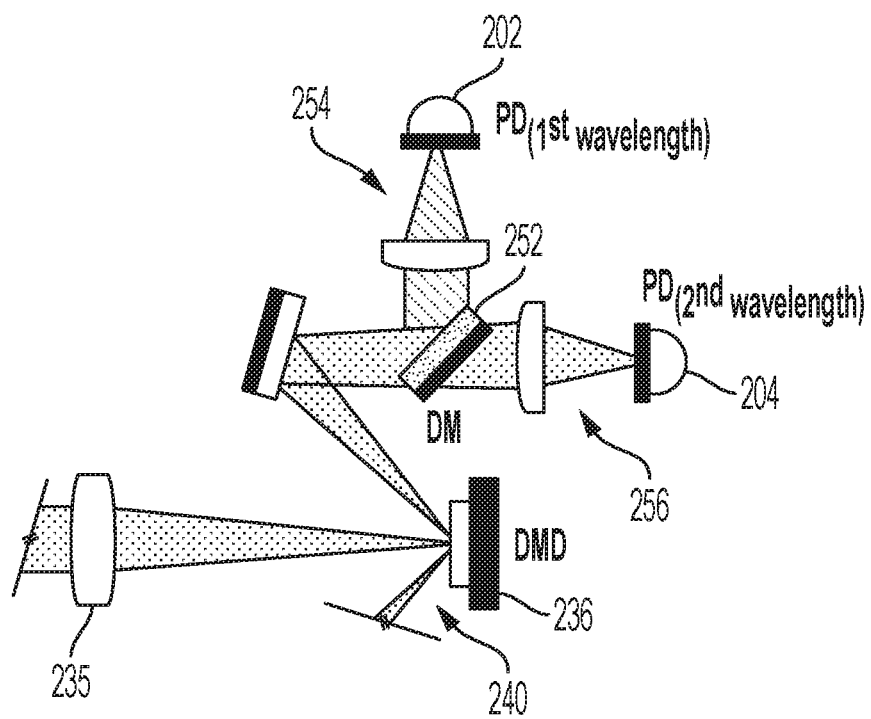
FIG. 2D is a schematic diagram of the example imaging system of FIG. 2A, but in which the single pixel camera includes a dichroic mirror.

FIG. 2D presents a schematic diagram of the example imaging system 200 of FIG. 2A, but in which the single pixel camera 201 includes a dichroic mirror 252. In these implementations, the single pixel camera 201 includes the first photodetector 202, the second photodetector 204, a micromirror device 236, and the dichroic mirror 252. The micromirror device 236 includes an array of micromirrors and is configured to selectively orient, in response to a control signal, one or more micromirrors in the array of micromirrors to define a spatial pattern. The dichroic mirror 252 is configured to split a structured optical signal from the micromirror device 236 into first and second wavelength optical signals. The first and second wavelength optical signals having, respectively, first and second spectral wavelengths (e.g., an individual wavelength, a distribution of wavelengths around an individual wavelength, a continuous range of wavelengths, etc.). For example, first and second spectral wavelength signals may have wavelengths in, respectively, the ultraviolet range and at about 852 nm. Although FIG. 2D depicts the dichroic mirror 252 as positioned to receive portions of the output optical signal from the positive portion of the spatial pattern defined by the array of micromirrors, the dichroic mirror 252 may be positioned to receive portions of the output optical signal from the negative portion of the spatial pattern. Other positions may also be possible.

A first wavelength optical pathway 254 extends from the dichroic mirror 252 to the first photodetector 202, and a second wavelength optical pathway 256 extends from the dichroic mirror 252 to the second photodetector 204. The first and second wavelength optical pathways 254, 256 may be defined by optical elements that guide the first and second wavelength optical signals from the dichroic mirror 252 to the first and second photodetectors 202, 204, respectively. Examples of the optical elements include lenses, mirrors, beam splitters, optical filters, fiber optic elements, and so forth. The dichroic mirror 252 is oriented to direct the first wavelength optical signal onto the first wavelength optical pathway 254 and the second wavelength optical signal onto the second wavelength optical pathway 256. The first photodetector 202 may correspond to a photodetector ($PD_{1st\ Wavelength}$) receiving portions of the output optical signal from the positive portion at the first wavelength (e.g., an ultraviolet wavelength), and the second photodetector 204 may correspond to a photodetector ($PD_{2nd\ Wavelength}$) receiving portions of the output optical signal from the positive portion at the second wavelength (e.g., a wavelength of about 852 nm). However, other polarities and wavelengths are possible for, respectively, the portions and spectral wavelengths.

Now referring back to FIG. 2A, the example imaging system 200 is configured for spatial imaging with the single pixel camera 201, where the micromirror device 236 is placed in the image plane of lens system 235 and the vapor-cell sensor 220 is placed in the object plane of the lens system 235. In this example, the first and second lasers 208, 212 are coupled in via optical fibers and combined on a cube beam splitter. In some variations, three or more lasers could be used to reduce the residual Doppler broadening of the transition in the vapor-cell sensor 220 and enhance sensitivity. In this example, the 509-nm optical signal is intensity modulated at a frequency $f_{mod}$ by an acousto-optic or electro-optic modulator (AOM/EOM) 216, but in general, there are other modulation options that may be used (e.g., phase or frequency modulation). Optical signals from both lasers 208, 212 propagate through the beam-shaping optics 218 to expand the laser beams (or input optical signals) to fill the imaging area of the vapor-cell sensor 220. The optical signals then pass through the beam splitter 230 and become incident on the vapor-cell sensor 220. The vapor-cell sensor 220 has an uncoated or anti-reflection coated front surface and a mirror-coated back surface 228, which retro-reflects the probe optical signal (i.e., the 852-nm optical signal) back through the vapor-cell sensor 220.

During operation of the example imaging system 200, Rydberg-atom electrometry is used to image the electromagnetic field from the test device 222 (or DUT) and optionally the reference antenna 224 and converts the electromagnetic field information from the radio-frequency domain to the optical domain. Part of the optical signal is then reflected from the beam splitter 230 into the imaging arm. A lens system 235, which in the example of FIG. 2A, is a single-element convex or bi-convex lens, is placed a distance 2f from both the vapor-cell sensor 220 and the micromirror device 236. Here, f is the focal length of the lens system 235 (or single-element convex or bi-convex lens). After reflection by the micromirror device 236, the optical signal is split into two components at angles θ=±24°, depending on a mask state or pattern of the array of micromirrors. However, the exact angle of reflection, θ, need not be ±24° and other angles are possible. For example, the angle of reflection, θ, may vary with a model of the micromirror device.

Each reflected spatial component is focused into the photodetectors 202, 204 (PD±) of the single pixel camera 201 which measure the total reflected intensity of the positive/negative portions of array of micromirrors. The example imaging system 200 may work with just one photodetector, such as illustrated in FIG. 1, but including dual photodetectors results in both positive and negative portions being measured at the same time. This dual measurement reduces the number of masks that are needed by a factor of two and allows for common-mode noise rejection between the two channels. The voltage from the two photodetectors 202, 204 is differenced and demodulated at $f_{mod}$ in the lock-in amplifier 242, and the resulting camera output data is passed into the analog-to-digital converter 244 for data processing. An acquisition system, which may be a computer system, or alternately, an application-specific board for enhanced acquisition speed (e.g., a system-on-chip or SOC), controls the pattern state of the micromirror device 236, and correlates the pattern state with the output voltage of the lock-in amplifier 242 to build an image by rapidly switching at a frequency $f<f_{mod}$ between patterns. The interference pattern generated by the superposition of the reference electromagnetic wave 226 and the test electromagnetic wave emitted from the test device 222 can be used to extract phase information about the test electromagnetic wave. The amplitude of the electromagnetic wave emitted from the test device 222 can be extracted directly from a measurement done in the absence of the reference electromagnetic wave 226. The limit to the spatial resolution of the image is set by the spatial resolution of the imaging optics and the size of the pixels (or micromirrors) in the array of micromirrors. The phase resolution is set primarily by the thickness of the vapor-cell sensor 220 and the spatial resolution of the optical imaging system. In FIG. 2A, the thickness of the vapor-cell sensor 220 extends along a direction from a top of FIG. 2A to a bottom of FIG. 2A.

To acquire an image, the micromirror device 236 rapidly switches between a series of optical patterns and an image is reconstructed computationally after a full set of data from different optical patterns has been acquired. In the high-field amplitude regime, one of the lasers of the laser system 206 is scanned in optical frequency across the atomic resonance lines of the atomic vapor in the vapor-cell sensor 220 to acquire several images of the spectral response of the example imaging system 200. This spectral response is used to extract the amplitude of the electromagnetic radiation (or field), which may be the amplitude of the electric portion of the electromagnetic radiation.

In the low-field amplitude regime, all lasers of the laser system 206 are fixed on resonance with the atomic transitions and the change in transmission due to the electromagnetic radiation is measured. The low-field amplitude regime is useful to work in since only a single image is needed to measure the amplitude of the electromagnetic radiation. Moreover, the electric field amplitude can be analyzed from the change in transmission of the probe laser due to the RF field, when both lasers are on resonance. For imaging, this configuration is more desirable since only a single optical frequency is required, and hence, only one optical image is required to measure the electric field (amplitude) image. This configuration also makes the imaging process faster than that for a high-field measurement. In the latter case, both lasers would be locked on resonance and a complete set of mask patterns projected to generate a single optical image, after which a conversion from optical transmission to electric field strength could be made. For the low-field amplitude regime, to extract the phase of the electromagnetic radiation, phase-shifting holography can be used, whereby the reference antenna 224 is phase shifted and the interference pattern between electromagnetic radiation from the test device 222 and reference antenna 224 is measured at several reference antenna phases.

FIG. 2B shows an alternate configuration of the example imaging system 200, where imaging is performed in the Fourier image plane rather than the real-space image plane. The optical configuration is similar to FIG. 2A except that the lens system 235 is placed at a distance f from the vapor-cell sensor 220 and a distance f from the micromirror device 236. On the micromirror device 236, this alternate configuration forms an image of the Fourier transform of the real-space image. Filtering in the Fourier domain can then be performed by altering the pattern sets that are projected from the micromirror device 236, which may be advantageous for certain applications.

In an alternate implementation, a liquid crystal display (LCD) or spatial light modulator (SLM) may be used instead of the micromirror device 236 to encode spatial information on the output optical signal. In some applications, the alternative implementation may be advantageous since both the liquid crystal display and the spatial light modulator can modify the intensity and/or phase of the output optical signal quasi-continuously. In contrast, the individual micromirrors of the micromirror device 236 represent a binary on/off pixel system. Use of a continuous variable modulator can be particularly useful in combination with compressive sampling techniques to image, for example, discrete cosine transform functions.

Any one of the optical configurations of FIG. 1 or 2A-2D can be combined with compressive sampling techniques to minimize the number of patterns required for image formation. The compressive sampling techniques therefore allow a speed-up of image acquisition and construction. Compressive sampling techniques are particularly effective when an image of electromagnetic radiation has low spatial frequencies, which is expected to be the case for the imaging of radio frequency fields. If the user has some prior knowledge of the expected spatial frequencies (e.g., from the design process of the test device and the radio frequency wavelength), compressive sampling can be further tailored and optimized for image acquisition speed while retaining the important image features.

The example image system 200 can be extended in several ways, two variations of which, are illustrated in respective FIGS. 2C and 2D. FIG. 2C shows a variation that allows polarization sensitive imaging. In this variation, the example imaging system 200 includes the polarizing beam splitter 246 along with an additional photodetector. Since the optical spectrum of the detection laser depends on the relative alignment of the laser and the radio frequency polarization, it may be possible to image the polarization state of the radio frequency field as well as the amplitude and phase. FIG. 2D shows a variation that allows multi-wavelength imaging. In this variation, the dichroic mirror 252 reflects one wavelength component of the patterned portion of the output optical signal and transmits another. Such operation may allow, for example, the detection of fluorescence from Rydberg state decay in the atomic vapor of the vapor-cell sensor 220. The state decay may be in the ultraviolet region of the photonic spectrum. Because the detection of fluorescence occurs in conjunction with the probe laser transmission, multi-wavelength imaging may allow correlated measurements of both fields with the same spatial information. Alternately, if the vapor-cell sensor 202 includes a dual- or multi-atomic species vapor (or a similar solid-state system with multiple species of color centers), a second set of excitation lasers could be used for the simultaneous detection of two or more independent radio-frequency fields with independent wavelengths.

Figure 3:
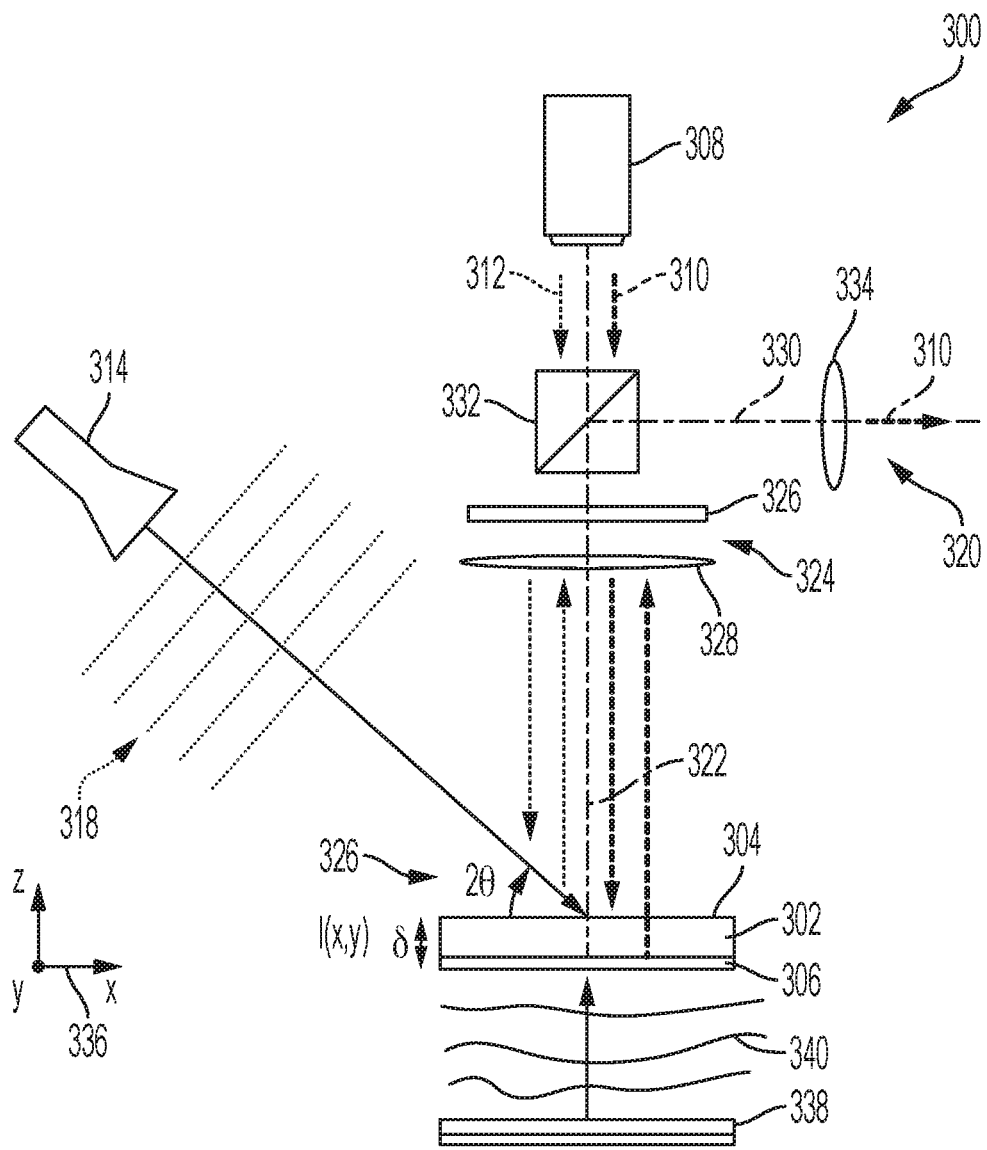
FIG. 3 is a schematic diagram of a portion of an example imaging system that includes a vapor-cell sensor.

Now referring to FIG. 3, a schematic diagram is presented of a portion of an example imaging system 300 that includes a vapor-cell sensor 302. The portion of the example imaging system 300 may be analogous to the portion of the example imaging system 200 extending upward in FIG. 2A from the laser system 206 to the reference antenna 224. The vapor-cell sensor 302 includes an optical window 304 and a dielectric mirror 306. The optical window 304 and the dielectric mirror 306 may be planar in shape and parallel to each other, as shown in FIG. 3. However, other configurations are possible for the optical window 304 and a dielectric mirror 306. The portion of the example imaging system 300 also includes a laser system 308 that is configured to generate at least two optical signals. Each optical signal may be a coherent beam of light defined, in part, by a wavelength that is concentrated around a single value (e.g., a beam of laser light). FIG. 3 depicts the laser system 308 as configured to generate two optical signals, i.e., a first optical signal 310 and a second optical signal 312. However, optical signals greater in number than two are possible. For example, the laser system 308 may be configured to generate three optical signals.

The example imaging system 300 additionally includes a reference antenna 314 disposed on a side 316 of the vapor-cell sensor 302 associated with the optical window 304. The reference antenna 314 is configured to generate a reference electromagnetic radiation 318 having one or both of a controlled amplitude and a controlled phase. The reference electromagnetic radiation 318 may be a plane wave of electromagnetic radiation, as illustrated in FIG. 3. However, other types of electromagnetic radiation are possible. Although the reference antenna 314 is depicted in FIG. 3 at an angle 20 to the vapor-cell sensor 302, other orientations are possible for the reference antenna. For example, the reference antenna 314 may be disposed behind the test device 338 and oriented to direct the reference electromagnetic radiation 318 into the vapor-cell sensor 302 through the dielectric mirror 306.

The portion of the example imaging system 300 also includes an optical imaging arm 320 that directs optical signals through a lens system 334 to a single pixel camera. The single pixel camera includes a patterned light generator (not shown), such as the patterned light generators 130, 234 of FIGS. 1 and 2A-2B. The single pixel camera may also, in some instances, include the lens system 334. In some implementations, such as shown in FIG. 3, the portion of the example imaging system 300 includes a first optical pathway 322 extending from the laser system 308, through the optical window 304 of the vapor-cell sensor 302, to the dielectric mirror 306. An optical assembly 324 is disposed on the first optical pathway 322 between the laser system 308 and the optical window 304 of the vapor-cell sensor 302. The optical assembly 324 may include optical components such as lenses, mirrors, filters, waveplates, beam splitters, and so forth. For example, the optical assembly 324 may include a waveplate 326 (e.g., a $\lambda/4$ waveplate) disposed on the first optical pathway 322 between the optical window 304 and the optical assembly 324. In another example, the optical assembly 324 may include a lens 328 disposed on the first optical pathway 322 between the optical window 304 and the optical assembly 324.

The portion of the example imaging system 300 also includes a second optical pathway 330 extending from the optical assembly 324 to the patterned light generator. The second optical pathway 330 may intersect the first optical pathway 322 and helps to define part of the optical imaging arm 320. For example, the second optical pathway 330 may intersect the first optical pathway 322 at an optical component of the optical assembly 324, such as at a beam splitter 332. The optical assembly 324 is configured to redirect at least one optical signal (e.g., an output optical signal) onto the second optical pathway 330 after interaction with the vapor-cell sensor 302. In some instances, the optical assembly 324 includes an optical filter 334 disposed on the second optical pathway 330 and configured to absorb or reflect wavelengths of at least one of the at least two optical signals. In this capacity, the optical filter 334 may control which and how many optical signals are received by the patterned light generator.

In operation, the laser system 308 of the example imaging system 300 may generate the at least two optical signals, e.g., the first optical signal 310 and the second optical signal 312, which subsequently propagate along the first optical pathway 322 to the vapor-cell sensor 302. During such propagation, the at least two optical signals 310, 312 may interact with the optical assembly 324, and as a result, have one or more characteristics altered (e.g., a direction, a focal point, a polarization, a wavelength distribution, etc.). The at least two beams of light pass through the vapor-cell sensor 302 by entering through the optical window 304 and reflecting off of the dielectric mirror 306. Upon reaching the optical assembly 324, at least one of the at least two optical signals are redirected towards the single pixel camera (e.g., towards the patterned light generator). For example, if the beam splitter 328 is present, the first optical signal 310 and the second optical signal 312 may both be redirected to the single pixel camera. An optical filter (not shown) on the second optical pathway 330 may then absorb the second optical signal 312, allowing the first optical signal 310 to continue to the optical imaging system 320.

Simultaneous with the generation of the at least two optical signals, the reference antenna 314 may generate reference electromagnetic radiation 318 that is received by the vapor-cell sensor 302. The reference electromagnetic radiation 318 interacts with vaporized atoms within the vapor-cell sensor, thereby changing an optical transmission through the vapor-cell sensor 302. Changes to the optical transmission may occur throughout an enclosed volume of the vapor-cell sensor 302 and thus be spatially-dependent. For example, FIG. 3 includes a coordinate axes 336 with they axis pointing into FIG. 3. The optical transmission (and changes thereto) may therefore be a function of three coordinate variables x, y, and z and thus be spatially-dependent in three dimensions. In variations where the vapor-cell sensor 302 is thin and planar, the optical transmission (and changes thereto) may be a function of only two coordinate variables x and y, and be spatially-dependent in two-dimensions (e.g., the x-y plane of FIG. 3). Other types of spatial dependence are possible.

Changes in the optical transmission of the vapor-cell sensor 302 may induce corresponding changes in an amplitude and a phase of the at least two optical signals. For example, one or both of the first optical signal 310 and the second optical signal 312 may experience changes in their respective amplitudes, phases, or both, while traversing the vapor-cell sensor 302 as input optical signals. In many instances, the at least two optical signals interact with vaporized atoms throughout the enclosed volume of the vapor-cell sensor 302 and thus represent a spatial dependence of the optical transmission. The optical assembly 324 may shape the at least two optical signals to image the spatial dependence of the optical transmission. For example, the optical assembly 324 may broaden a distribution of the at least two optical signals in a focal plane such that an image of the enclosed volume can be obtained in a single measurement.

Changes in the amplitudes, phases, or both, for each of the at least two optical signals may be measured by a single pixel camera of the example imaging system 300, such as the single pixel cameras 102, 201 described in relation to the example imaging systems 100, 200 of FIGS. 1 and 2A-2D. In some implementations, the example imaging system 300 includes a computer system in communication with the patterned light generator and one or more photodetectors of the single pixel camera (e.g., via electrical signals). The computer system is configured to generate image data from spatial properties of at least one optical signal, e.g., output optical signal 310. The data represents one or both of a spatially-dependent amplitude and a spatially-dependent phase of electromagnetic radiation, e.g., a spatially-dependent reference amplitude and a spatially-dependent reference phase of the reference electromagnetic radiation 318. In some instances, the data may represent a spatially-dependent frequency of electromagnetic radiation, a temporally-dependent frequency of electromagnetic radiation, or both. As such, the image data may correspond to an image of the electromagnetic radiation, e.g., an image of the reference electromagnetic radiation 318.

During operation of the example imaging system 300, the computer system may compare an image of the reference electromagnetic radiation 318 to a target image. For example, the computer system may determine a difference between a reference amplitude and a target amplitude. The amplitudes may be spatially-dependent and define respective two-dimensional images of amplitude. In another example, the computer system may determine a difference between a reference phase and a target phase. The phases may be spatially-dependent and define respective two-dimensional images of phase. Upon completing the comparison, the computer system may instruct the reference antenna 314 to alter one or more characteristics of the reference electromagnetic radiation 318 (e.g., a position, an amplitude, a phase, a frequency, etc.). For example, the reference antenna 314 may alter one of both of the reference amplitude in response to differences relative to, respectively, the target amplitude and the target phase. Such alternation may reduce a magnitude of the difference and assist in calibrating the reference antenna 314 (or the example imaging system 300).

In some implementations, such as shown in FIG. 3, the portion of the example imaging system 300 includes a test device 338 (or device-under-test) disposed adjacent the dielectric mirror 306 of the vapor-cell sensor 302 and configured to generate test electromagnetic radiation 340. When generated, the test electromagnetic radiation 340 interacts with vaporized atoms within the vapor-cell sensor to change an optical transmission through the vapor-cell sensor 302. The test electromagnetic radiation 340 may be imaged similarly to that already described for the reference electromagnetic radiation 318. In the absence of the reference electromagnetic radiation 318, a test amplitude of the test electromagnetic radiation 340 may be directly imaged. The test amplitude may be a spatially-dependent amplitude and define a two-dimensional image of test amplitude. In some instances, the computer system may compare an image of the test electromagnetic radiation 340 to a target image. Such comparison may assist the example imaging system 300 in determining if the test device 338 is performing within specification.

The example imaging system 300 may be operated such that the test device 338 generates the test electromagnetic radiation 340 while the reference antenna 314 generates the reference electromagnetic radiation 318. In this situation, the vapor-cell sensor 302 receives a superimposed electromagnetic radiation, which corresponds to an interference pattern of the test electromagnetic radiation 340 with the reference electromagnetic radiation 318 at the vapor-cell sensor 302. The superimposed electromagnetic radiation may be imaged similarly to that already described for the reference electromagnetic radiation 318. The computer system may extract an image of the reference electromagnetic radiation 318 (previously obtained) from an image of the superimposed electromagnetic radiation to produce an image of the test electromagnetic radiation 340. The image of the test electromagnetic radiation 340 may allow a test phase of the test electromagnetic radiation 340 to be determined. The test phase may be a spatially-dependent phase and define a two-dimensional image of the test phase. The image of the test electromagnetic radiation 340 may also allow a test frequency of the test electromagnetic radiation 340 to be determined. The test frequency may be a spatially-dependent frequency and define a two-dimensional image of the test frequency.

The example imaging system 300 may also obtain images of the test electromagnetic radiation 340 by iterating the reference electromagnetic radiation 318 through multiple phases. For example, the example imaging system 300 may cause the reference antenna 314 to alter the reference phase of the reference electromagnetic radiation to generate at least three instances of superimposed electromagnetic radiation. Each instance may correspond to an instance of the reference electromagnetic radiation 318 at a different reference phase. In this mode of operation, the example imaging system 300 determines the test amplitude and the test phase of the test electromagnetic radiation 340 based on one or both of a superimposed amplitude and a superimposed phase for each instance of superimposed electromagnetic radiation and one or both of a reference amplitude and a reference phase for each corresponding instance of the reference electromagnetic radiation. The test frequency may also be determined.

In some implementations, the example imaging system 300 (or portion thereof) is operable to conduct over-the-air (OTA) testing. OTA testing can measure the total radiated power (TRP), total isotropic sensitivity (TIS), effective isotropic radiated power (EIRP), and effective isotropic sensitivity (EIS) of a device-under-test, such as a wireless device. Such measurements include the characterization of radiation patterns, linearization, and sensitivity. OTA tests may be carried out on systems during their research and development, production, and integration phases (e.g., such as refitting the radar systems in a car as maintenance). Other phases or times are also possible.

In some cases, the example imaging system 300 can measure, or image, the interference pattern between the radiated electric fields produced by a device-under-test (DUT) and a fixed position reference antenna using Rydberg atom electrometry. This measurement process creates an image (or holographic image) from which the phase and amplitude of the radiated electric field can be retrieved. The reference antenna may produce a plane wave at the position of the measurement and may be referenced via feedback to a Rydberg atom sensor used as an absolute calibration source. In some cases, the measurement requires that three images be acquired in order to determine the phase and amplitude of the electromagnetic field produced by the DUT. Measurements that can accomplish this task include analogs of phase shifting holographic interferometry, where the ability to phase shift the reference wave is used to take multiple images. The measurements also include heterodyne holography, where the reference wave and/or the test wave is modulated in time or deconvolved from the interference pattern computationally. In some implementations, a holographic imaging system uses atoms as the detector. A single pixel camera comprising one or more single element detectors (e.g., photodetectors) may be used to image the response, in the optical domain, of the atoms to the high frequency fields. In some cases, the vapor-cell sensor 302 can be made thin so that high phase resolution can be achieved. The device can be specifically targeted for imaging the electromagnetic fields of high frequency devices such as antennas. The radiated electric field phase, amplitude, and frequency information can be acquired (e.g., in real time) so that the DUT can be tuned or tested. This information may allow the DUT to be passed, failed or otherwise processed on an assembly line, for example, using a matched, spatial filter to which the measured radiation pattern can be correlated. A frequency of electromagnetic radiation emitted from the DUT may also be determined and compared to a target frequency.

For pass/fail testing, such as may be implemented on an assembly line, or similar applications, such as sorting or grading of devices by their relative performance (as is common in the semiconductor industry), electromagnetic field imaging with the single-pixel camera can be extremely efficient. In this case only a small number of mask patterns, even a single mask pattern, would be projected from the variable mask of the patterned light generator (e.g., a micromirror device). The mask patterns form a programmable matched spatial filter for the intended DUT. In the high field regime, the single mask pattern would be combined with a sweep of one of the laser frequencies to measure the spectrum for that particular mask. This spectrum could be then compared with a target or reference spectrum for pass/fail testing, or the individual spectral features can be analyzed in more detail to facilitate the sorting of test devices. Such sorting could allow the sorting/grading of devices based on the amount of side-lobe suppression, and where the variable mask is tailored to image only at the position of the expected side-lobes.

The example imaging system 300 (or portion thereof) can provide technical advantages and improvements. For example, one or more of the following advantages and improvements may be provided in various implementations: phase, amplitude, and frequency information may be retrieved using an absolutely calibrated method; multiple field points may be measured at the same time, so that the electromagnetic field is imaged and can be used to either test or optimize the radiation pattern of the DUT; spatial resolution of the detector can be very high so that the structure of the entire field can be determined, also in the near field; the sensor can include dielectric materials so that it minimally perturbs the electromagnetic field; the measurement may be integrated into an assembly line to test antennas as they are manufactured; the formation of beams from multiple element antennas may be improved by adjusting the phase of the signals at each antenna element using the images acquired; using the holographic data, images of the electromagnetic radiation can be generated at other positions, including at the DUT, for example, using a Fresnel transform or other type of wave propagation algorithm; the thickness of the sensor (e.g., δ in FIG. 3) can be made subwavelength to obtain high phase resolution; the field intensity pattern alone may be enough to characterize a DUT. Other advantages and improvements are possible.

In FIG. 3, the portion of the example imaging system 300 includes a thin vapor-cell sensor 302, optical readout lasers 310, 312, imaging optics 324 for the lasers, and the reference antenna 314. The DUT 338 is placed near the dielectric mirror 306 of the vapor-cell sensor 302, which holds alkali atoms. The alkali atoms are used via Rydberg atom-based electric field sensing to detect high frequency electric fields 340 emitted from the DUT 338 and the reference wave 318. In Rydberg atom-based electrometry, the optical fields readout an effect that the high frequency electromagnetic fields have on the vaporized atoms contained in the vapor-cell sensor 302. In FIG. 3, a large planar vapor-cell sensor 302 is used so that the electromagnetic fields from the DUT 338 can be imaged. The vapor-cell sensor 302 is constructed so that the laser light is reflected from the rear surface (or dielectric mirror 306) of the vapor-cell sensor 302. The reflected probe laser light 310 is then imaged using one or more single pixel cameras so that the spatial image of the electromagnetic field emanating from the DUT 338 can be measured. The probe light 310 may be separated from the coupling laser light 312 with a narrow bandwidth optical filter on the optical imaging arm 320. The reference antenna 314, whose emission amplitude can be referenced to a Rydberg atom-based sensor 302 so that the amplitude of the reference wave 318 is fixed via active feedback, also can illuminate the vapor-cell sensor 302. The interference pattern generated by the superposition of the reference electromagnetic wave 318 and the test electromagnetic wave 340 emitted from the DUT 338 can be used to extract the phase information about the test electromagnetic wave. The amplitude of the electromagnetic wave emitted from the DUT 338 can be extracted directly from a measurement done in absence of the reference electromagnetic wave 318.

The spatial resolution of the image is set by the spatial resolution of the imaging optics 324. The phase resolution is set primarily by the vapor-cell sensor thickness, δ, and the spatial resolution of the optical image. θ in FIG. 3 can equal about 45 degrees if additional optics, which are transparent to the high frequency radiation, are used to redirect the light. This arrangement allows for the reference wave 318 to back illuminate the vapor-cell sensor 302. The phase of the reference wave 318 can be controlled via an oscillator that drives the reference antenna 314. A variable phase allows phase shifting holography to be performed with the example imaging system 300. The vapor-cell sensor 320 acts analogous to a photographic plate or CCD array that records the electromagnetic waves and their interference patterns. If the reference wave 318 is well-known then the information from the test electromagnetic field 340 can be extracted from the interference pattern and the test field amplitude, or some other combination of those and phase shifted interference patterns, digitally, similar to digital holography. The test electromagnetic field 340 and the reference electromagnetic field 318 can be of similar amplitude at the sensor. To acquire signals, a series of images at different probe or coupling laser frequencies 310, 312 can be measured and the spectral response of the example imaging system 300, e.g., the transmission of the probe laser 310, can be used to extract the net amplitude of the respective electric fields. In a different type of measurement, e.g., for smaller amplitude electromagnetic fields, the transmission of the probe laser 310 on resonance in the presence of the coupling laser can be used to determine the high frequency field power. The latter measurement may provide faster data acquisition since a single measurement can be used to characterize each of the electromagnetic field amplitudes of the reference, test, and superposition of the two fields. Images using the spectral response can also be acquired in short times, thereby enabling throughput sufficient for video frame rates (e.g., 20-30 Hz).

Reconstructing an image with a single pixel camera involves switching between a set of optical patterns, such as that generated by a selectively-variable mask pattern, and recording the total reflected light intensity for each optical pattern. These optical patterns are then weighted according to their light intensity and summed together to form a final image. The number of optical patterns needed scales with the image spatial resolution. Sets of optical patterns may be selected using several choices. For example, a set of optical patterns may be selected using Hadamard matrices. Random optical patterns may also be used, but since there may be a significant overlap between optical patterns, many more optical patterns may be needed to reconstruct an image. However, use of random optical patterns in conjunction with active feedback and optimization algorithms may reduce the number of random optical patterns required to construct an image.

Symmetry and a priori knowledge also reduce the number of patterns required. For example, in the case of antenna imaging, some information about the electromagnetic field can be known a priori, such as the field will be smoothly varying and most-likely have some symmetry. Electromagnetic field imaging in both high- and low-field regimes can benefit from this knowledge to select or exclude some of the complete set of mask patterns. Iterative algorithms can be used to either increase image resolution for a given acquisition time, or alternatively, decrease the image acquisition time for a given resolution. As an example, an antenna may be configured such that its emitted electromagnetic field has 4-fold symmetry. A first, low-resolution image could be used to determine the center and axes of the 4-fold symmetry, after which, the acquisition of an image could be reduced to a single quadrant. Such a reduction in area decreases the number of effective pixels by a factor of 4. Analogous cases for other symmetries would provide similar opportunities for increasing the speed of image acquisition. This technique would operate independently of other compressive sampling techniques, and in some cases, could be combined for even greater speed improvements.

In another variation, compressive sampling techniques can be used to reduce the number of patterns needed. Such techniques are based on commonly-used digital image compression techniques. But instead of first acquiring a complete image and then compressing it, the compression is applied to the image acquisition itself. The sets of optical patterns used for the compression can be based on discrete cosine transforms (e.g., as used in the original JPEG-compression algorithm), or other transforms which select discrete spatial frequencies in the image. As with any image compression technique, the effectiveness of the compression—the reduction in image size for conventional image compression, or the reduction in the number of required patterns in the case of the single pixel camera—depends on the contents of the image. If some of the spatial frequencies expected in the image are known in advance (for example, based on the radio frequency wavelength and feature size in the test antenna device), the compression algorithm can be effectively tailored to cut out higher spatial frequencies, and hence be made very efficient.

In the single pixel camera, since one or more photodetectors are used, signal processing techniques can be applied in the analog domain before the signal is digitized, and the detection of electromagnetic fields can be AC-coupled. This approach circumvents the requirement for high dynamic range in a DC-coupled sensor entirely. One example of this type of imaging system is realized by modulating one of the signal control parameters, e.g., the coupling laser intensity in FIG. 1, 2A, or 2B. By tuning the gain/sensitivity of a demodulated signal, the dynamic range may be selected on-the-fly and can therefore be optimized on a per-image basis. Other modulation methods are possible for increases in the signal-to-noise ratio such as frequency modulation or phase modulation.

Alternately, the demodulation and signal processing can be done in software (e.g., in the fabric of a field-programmable gate array), as long as fast and high-resolution analog-to-digital conversion is done. For single-channel analog-to-digital converters, 16-bits and 100 millions of samples per second are easily possible. The distributions of all optical pattern intensity values can be measured and used for rigorous error propagation, so that maximum likelihood algorithms can be used, and each pixel in the final image has its own associated error bar. In order to isolate the signal from a noisy background, the modulation rate can be higher than other significant noise frequencies, e.g., 50/60 Hz AC power line noise and its harmonics. In many variations, modulation frequencies of around 5-10 kHz are desired. The requirement for demodulation to be done on a pixel-by-pixel basis means this technique is not compatible with conventional CCD/CMOS sensors.

The systems and methods described herein may be applied to image electromagnetic fields having high amplitudes. Such imaging may be a form of hyperspectral imaging in which each "pixel" in the image has an associated spectrum. At a single "pixel," the measurement of the RF field is accomplished by measuring the spectral splitting of the EIT signal, requiring that one of the lasers be scanned to generate an optical spectrum. A "pixel" is not necessarily associated with a single micromirror or optically resolvable section of the vapor cell sensor. Instead, the "pixel" can be a section of the image that is averaged over at the expense of obtaining the maximum resolution of the entire RF field imaging system.

A spectrum may be generated at each pixel by taking a 'complete' image at each frequency of the laser scan. This approach is general, although a determination of when an image is 'complete' can be informed by additional knowledge of the test field (e.g., field symmetry, spatial frequencies, etc.) This additional knowledge may reduce the number of patterned masks required. In the approach, the transmission as a function of frequency is mapped out at each pixel by obtaining a series of images, each corresponding to a particular laser frequency. For the most general case, e.g., where a test electromagnetic field is completely unknown (in spatial distribution and intensity and/or phase), one of the lasers may be scanned across the resonance lines in discrete frequency steps. At each optical frequency step, a complete series of mask patterns is projected to generate a single image for that optical frequency. The resulting data is then combined into an array where each pixel has a corresponding optical spectrum. The electric field amplitude and frequency can be inferred from analysis of the optical spectra at each pixel, finally forming the image of electric field amplitude. The phase can be inferred in a similar process through holographic measurements with a reference RF field in conjunction with the test field, where multiple electric field images at different reference RF phases are required.

A spectrum may also be determined for each mask. It is possible to use mask patterns corresponding to areas of the image where the field should be the same, "pixels" or pixels arranged via a priori knowledge, and acquire a spectrum by scanning one of the lasers while the corresponding mask pattern is activated. Here, the image is acquired by obtaining spectra for each important section or "pixel" of the image. One variation of this approach is to group sections of the image in, for example, square or circular blocks over which the field variance is negligible, i.e., making "pixels" that correspond to the required resolution. A full spectrum is acquired for each block. Moreover, mask patterns may be selected that correspond to areas of the image where the target field is uniform or can be averaged over. Such selection may be based on symmetry in the field or some type of pixelization (e.g., small pixels in regions of interest and large pixels where there should be less variation and/or interest). For each mask pattern, a spectrum is then taken by scanning one of the lasers from which the field amplitude (and potentially phase) is derived. The image is reconstructed by combining the values of the field parameters obtained for each mask.

In some implementations, an example imaging method includes receiving, at a vapor-cell sensor, input optical signals and electromagnetic radiation from at least a test device to generate an output optical signal. The electromagnetic radiation may have a frequency ranging from 100 MHz to 1 THz. The example imaging method also includes processing the output optical signal at a single pixel camera to generate camera output data and, by operation of a computer system, constructing an image of the electromagnetic radiation based on the camera output data. The electromagnetic radiation may optionally include reference electromagnetic radiation generated from a reference antenna. In some variations, the vapor-cell sensor includes a dielectric mirror. In these variations, receiving the input optical signals and the electromagnetic radiation includes passing the input optical signals through a vapor in the vapor-cell sensor, and while passing, reflecting one or more of the input optical signals off the dielectric mirror to produce one or more respective output optical signals. The one or more respective output optical signals may, in some instances, propagate counter to the one or more input optical signals. In some variations, the example imaging method includes modulating an amplitude, a phase, or a frequency of at least one of the input optical signals before receiving the input optical signals and electromagnetic radiation at the vapor-cell sensor. The amplitude, the phase, and the frequency may be modulated individually or in any combination.

In some implementations, the single pixel camera includes a patterned light generator and a photodetector. Examples of patterned light generator include a micromirror device (e.g., a DMD), a spatial light modulator, or a liquid crystal display. Other types of patterned light generators are possible. In these implementations, the imaging method includes receiving, at the photodetector, patterned instances of the output optical signal generated by the patterned light generator. Each patterned instance represents a respective portion of the image of the electromagnetic radiation. Moreover, processing the output optical signal includes measuring, by operation of the single pixel camera (e.g., by operation of at least the photodetector), the intensity of each patterned instance to generate the camera output data. In further implementations, the example imaging method includes filtering the camera output data by removing patterned instances from the camera output data if their respective measured intensities are less than a respective threshold intensity. The example imaging method also includes constructing the image of the electromagnetic radiation based on the filtered camera output data.

In some implementations, the single-pixel camera includes a photodetector and an array of micromirrors. In such implementations, processing the output optical signal includes interacting the output optical signal with the array of micromirrors. While interacting, one or more micromirrors in the array of micromirrors are selectively oriented to iterate the array of micromirrors through a series of spatial patterns. Each spatial pattern generates a respective structured optical signal from the array of micromirrors. Processing the output optical signal also includes measuring an intensity of each structured optical signal with the photodetector to generate the camera output data. In some variations, constructing the image of the electromagnetic radiation includes determining one or both of a spatially-dependent amplitude, a spatially-dependent phase, or a spatially-dependent frequency of the electromagnetic radiation based on the measured intensities of each structured optical signal. Combinations of the spatially-dependent amplitude, the spatially-dependent phase, or the spatially-dependent frequency may also be determined. In some variations, interacting the output optical signal includes imaging the output optical signal onto the array of micromirrors with a lens system. The lens system is disposed along an optical pathway extending from the vapor-cell sensor to the array of micromirrors. The lens system may include a lens having a focal length. In some variations, the vapor-cell sensor and the array of micromirrors are spaced from the lens along the optical pathway a distance twice the focal length of the lens. In some variations, the vapor-cell sensor and the array of micromirrors are spaced from the lens along the optical pathway a distance equal to the focal length of the lens. Other distances are possible. In some variations, the lens system defines a real-space image plane on the optical pathway and the array of micromirrors receives the output optical signal at the real-space image plane. In some variations, the lens system defines a Fourier image plane on the optical pathway and the array of micromirrors receives the output optical signal at the Fourier image plane.

In some implementations, the single-pixel camera includes a photodetector and an array of micromirrors. In these implementations, processing the output optical signal includes interacting the output optical signal with the array of micromirrors. While interacting, one or more micromirrors in the array of micromirrors are selectively oriented to iterate the array of micromirrors through a series of spatial patterns. Each spatial pattern generates a respective structured optical signal from the array of micromirrors. Moreover, each spatial pattern includes a positive portion and a negative portion. The negative portion corresponds to an inverse of the positive portion. In such implementations, processing the output optical signal also includes measuring an intensity of each structured optical signal with the single pixel camera to generate the camera output data. In some variations, each structured optical signal includes a first portion and a second portion generated from, respectively, a positive portion and a negative portion of a spatial pattern. Moreover, the photodetector is a first photodetector and the single pixel camera includes a second photodetector. In these variations, measuring the intensity includes measuring an intensity of the first portion of each structured optical signal with the first photodetector to generate first camera output data and measuring an intensity of the second portion of each structured optical signal with a second photodetector to generate second camera output data. In these variations, the camera output data includes the first and second camera output data.

In some implementations, the single-pixel camera includes a photodetector. In these implementations, processing the output optical signal includes interacting the output optical signal with an array of micromirrors. While interacting, one or more micromirrors in the array of micromirrors are selectively oriented to iterate the array of micromirrors through a series of spatial patterns. Each spatial pattern generates a respective structured optical signal from the array of micromirrors. Moreover, each spatial pattern includes a positive portion and a negative portion. The negative portion corresponds to an inverse of the positive portion. In such implementations, processing the output optical signal also includes measuring an intensity of each structured optical signal with the single pixel camera to generate the camera output data. In some variations, the photodetector is a first photodetector and the single pixel camera includes a polarizing beam splitter and a second photodetector. In these variations, the structured optical signals include respective portions all generated from either a positive portion or a negative portion of a spatial pattern. Moreover, processing the output optical signal includes splitting each of the respective portions into first and second polarized optical signals using the polarizing beam splitter. The first and second polarized optical signals have, respectively, first and second polarizations. Furthermore, measuring the intensity includes measuring an intensity of each first polarized optical signal with the first photodetector to generate first camera output data and measuring an intensity of each second polarized optical signal with a second photodetector to generate second camera output data. The camera output data includes the first and second camera output data.

In some implementations, the single-pixel camera includes a photodetector. In these implementations, processing the output optical signal includes interacting the output optical signal with an array of micromirrors. While interacting, one or more micromirrors in the array of micromirrors are selectively oriented to iterate the array of micromirrors through a series of spatial patterns. Each spatial pattern generates a respective structured optical signal from the array of micromirrors. Moreover, each spatial pattern includes a positive portion and a negative portion. The negative portion corresponds to an inverse of the positive portion. In such implementations, processing the output optical signal also includes measuring an intensity of each structured optical signal with the single pixel camera to generate the camera output data. In these implementations, processing the output optical signal also includes measuring an intensity of each structured optical signal with the single pixel camera to generate the camera output data. In some variations, the photodetector is a first photodetector and the single pixel camera includes a dichroic mirror and a second photodetector. In these variations, the structured optical signals include respective portions all generated from either a positive portion or a negative portion of a spatial pattern. Moreover, processing the output optical signal includes splitting each of the respective portions into first and second wavelength optical signals using a dichroic mirror. The first and second wavelength optical signals have, respectively, first and second wavelengths. Furthermore, measuring the intensity includes measuring an intensity of each first wavelength optical signal with the first photodetector to generate first camera output data and measuring an intensity of each second wavelength optical signal with a second photodetector to generate second camera output data. The camera output data includes the first and second camera output data.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. An imaging method, comprising:
receiving, at a vapor-cell sensor, input optical signals and electromagnetic radiation from at least a test device to generate an output optical signal;
processing the output optical signal at a single pixel camera to generate camera output data, the single pixel camera comprising a patterned light generator; and
by operation of a computer system, constructing an image of the electromagnetic radiation based on the camera output data.

2. The imaging method of claim 1,
wherein the vapor-cell sensor comprises a dielectric mirror; and
wherein receiving the input optical signals and the electromagnetic radiation comprises:
passing the input optical signals through a vapor in the vapor-cell sensor, and
while passing, reflecting one or more of the input optical signals off the dielectric mirror to produce one or more respective output optical signals.

3. The imaging method of claim 2, wherein the one or more respective output optical signals propagate counter to the one or more input optical signals.

4. The imaging method of claim 1, wherein the electromagnetic radiation comprises reference electromagnetic radiation generated from a reference antenna.

5. The imaging method of claim 1,
wherein the single pixel camera comprises a photodetector;
wherein the imaging method comprises:
receiving, at the photodetector, patterned instances of the output optical signal generated by the patterned light generator, each patterned instance representing a respective portion of the image of the electromagnetic radiation; and
wherein processing the output optical signal comprises measuring, by operation of at least the photodetector, the intensity of each patterned instance to generate the camera output data.

6. The imaging method of claim 5, comprising:
filtering the camera output data by removing patterned instances from the camera output data if their respective measured intensities are less than a respective threshold intensity, and
constructing the image of the electromagnetic radiation based on the filtered camera output data.

7. The imaging method of claim 1,
wherein the single pixel camera comprises a photodetector and the patterned light generator comprises an array of micromirrors; and
wherein processing the output optical signal comprises:
interacting the output optical signal with the array of micromirrors;
while interacting, selectively orienting one or more micromirrors in the array of micromirrors to iterate the array of micromirrors through a series of spatial patterns, each spatial pattern generating a respective structured optical signal from the array of micromirrors; and
measuring an intensity of each structured optical signal with the photodetector to generate the camera output data.

8. The imaging method of claim 7, wherein constructing the image of the electromagnetic radiation comprises:
determining a spatially-dependent amplitude, a spatially-dependent phase, or a spatially-dependent frequency of the electromagnetic radiation based on the measured intensities of each structured optical signal.

9. The imaging method of claim 7, wherein interacting the output optical signal comprises:
imaging the output optical signal onto the array of micromirrors with a lens system, the lens system disposed along an optical pathway extending from the vapor-cell sensor to the array of micromirrors.

10. The imaging method of claim 9, wherein the lens system defines a real-space image plane on the optical pathway and the array of micromirrors receives the output optical signal at the real-space image plane.

11. The imaging method of claim 9, wherein the lens system defines a Fourier image plane on the optical pathway and the array of micromirrors receives the output optical signal at the Fourier image plane.

12. The imaging method of claim 7, wherein each spatial pattern comprises a positive portion and a negative portion, the negative portion corresponding to an inverse of the positive portion.

13. The imaging method of claim 12,
wherein the photodetector is a first photodetector and the single pixel camera comprises a second photodetector;
wherein each structured optical signal comprises a first portion and a second portion generated from, respectively, a positive portion and a negative portion of a spatial pattern;
wherein measuring the intensity comprises:
measuring an intensity of the first portion of each structured optical signal with the first photodetector to generate first camera output data, and
measuring an intensity of the second portion of each structured optical signal with a second photodetector to generate second camera output data; and
wherein the camera output data comprises the first and second camera output data.

14. The imaging method of claim 12,
wherein the photodetector is a first photodetector and the single pixel camera comprises a polarizing beam splitter and a second photodetector;
wherein the structured optical signals comprise respective portions all generated from either a positive portion or a negative portion of a spatial pattern;
wherein processing the output optical signal comprises splitting each of the respective portions into first and second polarized optical signals using the polarizing beam splitter, the first and second polarized optical signals having, respectively, first and second polarizations;
wherein measuring the intensity comprises:
measuring an intensity of each first polarized optical signal with the first photodetector to generate first camera output data, and
measuring an intensity of each second polarized optical signal with the second photodetector to generate second camera output data; and
wherein the camera output data comprises the first and second camera output data.

15. The imaging method of claim 12,
wherein the photodetector is a first photodetector and the single pixel camera comprises a dichroic mirror and a second photodetector;
wherein the structured optical signals comprise respective portions all generated from either a positive portion or a negative portion of a spatial pattern;
wherein processing the output optical signal comprises splitting each of the respective portions into first and second wavelength optical signals using the dichroic mirror, the first and second wavelength optical signals having, respectively, first and second wavelengths;

wherein measuring the intensity comprises:
measuring an intensity of each first wavelength optical signal with the first photodetector to generate first camera output data, and
measuring an intensity of each second wavelength optical signal with the second photodetector to generate second camera output data; and wherein the camera output data comprises the first and second camera output data.

16. The imaging method of claim 1, comprising:
before receiving, modulating an amplitude, a phase, or a frequency of at least one of the input optical signals.

17. An imaging system, comprising:
a laser system;
a vapor-cell sensor configured to receive electromagnetic radiation from at least a test device and to generate an output optical signal based on input optical signals from the laser system;
a single pixel camera configured to generate camera output data by processing the output optical signal from the vapor-cell sensor, the single pixel camera comprising a patterned light generator configured to receive the output optical signal and generate patterned instances of the output optical signal; and
a computer system configured to generate an image of the electromagnetic radiation based on the camera output data.

18. The imaging system of claim 17, wherein
the patterned light generator comprises a variable mask configured to selectively switch between optical patterns in response to a control signal.

19. The imaging system of claim 18, wherein the patterned light generator is a micromirror device.

20. The imaging system of claim 18, wherein the patterned light generator is a spatial light modulator.

21. The imaging system of claim 18, wherein the patterned light generator is a liquid crystal display.

22. The imaging system of claim 18, comprising:
an optical pathway extending from the vapor-cell sensor to the patterned light generator; and
a lens system disposed along the optical pathway extending from the vapor-cell sensor to the patterned light generator, the lens system configured to image the output optical signal onto the patterned light generator.

23. The imaging system of claim 22,
wherein the lens system defines a real-space image plane on the optical pathway; and
wherein the patterned light generator is disposed on the optical pathway at the real-space image plane.

24. The imaging system of claim 22,
wherein the lens system defines a Fourier image plane on the optical pathway; and
wherein the patterned light generator is disposed on the optical pathway at the Fourier image plane.

25. The imaging system of claim 17, comprising a reference antenna configured to generate reference electromagnetic radiation that is received by the vapor-cell sensor.

26. The imaging system of claim 17,
wherein the patterned light generator is a micromirror device comprising an array of micromirrors and configured to selectively orient, in response to a control signal, one or more micromirrors in the array of micromirrors to define a spatial pattern;
wherein the single pixel camera comprises:
a photodetector, and
an optical pathway extending from the micromirror device to the photodetector; and
wherein the spatial pattern is configured to generate a structured optical signal when the output optical signal interacts with the array of micromirrors.

27. The imaging system of claim 17,
wherein the patterned light generator is a micromirror device comprising an array of micromirrors and configured to selectively orient, in response to a control signal, one or more micromirrors in the array of micromirrors to define a spatial pattern;
wherein the single pixel camera comprises:
a first photodetector and a second photodetector,
a first optical pathway extending from the micromirror device to the first photodetector, and
a second optical pathway extending from the micromirror device to the second photodetector; and
wherein the spatial pattern is configured to generate a structured optical signal when the output optical signal interacts with the array of micromirrors, the spatial pattern comprising:
a positive portion configured to reflect a first portion of the structured optical signal onto the first optical pathway, and
a negative portion configured to reflect a second portion of the structured optical signal onto the second optical pathway, the negative portion corresponding to an inverse of the positive portion.

28. The imaging system of claim 27, comprising:
a demodulation system electrically coupled to the first and second photodetectors;
wherein the computer system is configured to generate:
control signals for the micromirror device, and
image data in response to demodulated signals from the demodulation system, the image data representing a spatially-dependent amplitude of the electromagnetic radiation, a spatially-dependent phase of the electromagnetic radiation, a spatially-dependent frequency of the electromagnetic radiation, or any combination thereof.

29. The imaging system of claim 17,
wherein the patterned light generator is a micromirror device comprising an array of micromirrors and configured to selectively orient, in response to a control signal, one or more micromirrors in the array of micromirrors to define a spatial pattern;
wherein the single pixel camera comprises:
a first photodetector and a second photodetector,
a polarizing beam splitter configured to split a structured optical signal from the micromirror device into first and second polarized optical signals, the first and second polarized optical signals having, respectively, first and second polarizations,
a first polarized optical pathway extending from the polarizing beam splitter to the first photodetector, and
a second polarized optical pathway extending from the polarizing beam splitter to the second photodetector, wherein the polarizing beam splitter is oriented to direct the first polarized optical signal onto the first polarized optical pathway and the second polarized optical signal onto the second polarized optical pathway.

30. The imaging system of claim 17, wherein the patterned light generator is a micromirror device comprising an array of micromirrors and configured to selectively orient, in response to a control signal, one or more micromirrors in the array of micromirrors to define a spatial pattern;

wherein the single pixel camera comprises:
- a first photodetector and a second photodetector,
- a dichroic mirror configured to split a structured optical signal from the micromirror device into first and second wavelength optical signals, the first and second wavelength optical signals having, respectively, first and second wavelengths,
- a first wavelength optical pathway extending from the dichroic mirror to the first photodetector, and
- a second wavelength optical pathway extending from the dichroic mirror to the second photodetector,
- wherein the dichroic mirror is oriented to direct the first wavelength optical signal onto the first wavelength optical pathway and the second wavelength optical signal onto the second wavelength optical pathway.

* * * * *